(12) United States Patent
Lee et al.

(10) Patent No.: US 11,930,641 B2
(45) Date of Patent: Mar. 12, 2024

(54) SEMICONDUCTOR DEVICES

(71) Applicant: SAMSUNG ELECTRONICS CO., LTD., Suwon-si (KR)

(72) Inventors: Jeonggil Lee, Suwon-si (KR); Taisoo Lim, Seoul (KR); Hauk Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 281 days.

(21) Appl. No.: 17/206,277

(22) Filed: Mar. 19, 2021

(65) Prior Publication Data
US 2022/0037351 A1    Feb. 3, 2022

(30) Foreign Application Priority Data

Aug. 3, 2020 (KR) .................. 10-2020-0096793

(51) Int. Cl.
| | |
|---|---|
| *H10B 43/50* | (2023.01) |
| *H01L 21/768* | (2006.01) |
| *H01L 23/535* | (2006.01) |
| *H10B 41/27* | (2023.01) |
| *H10B 41/41* | (2023.01) |
| *H10B 41/50* | (2023.01) |
| *H10B 43/27* | (2023.01) |
| *H10B 43/40* | (2023.01) |

(52) U.S. Cl.
CPC ....... *H10B 43/50* (2023.02); *H01L 21/76805* (2013.01); *H01L 21/76895* (2013.01); *H01L 23/535* (2013.01); *H10B 41/27* (2023.02); *H10B 41/41* (2023.02); *H10B 41/50* (2023.02); *H10B 43/27* (2023.02); *H10B 43/40* (2023.02)

(58) Field of Classification Search
CPC ........ H10B 43/50; H10B 41/27; H10B 41/41; H10B 41/50; H10B 43/27; H10B 43/40; H01L 21/76805; H01L 21/76895; H01L 23/535

See application file for complete search history.

(56) References Cited

U.S. PATENT DOCUMENTS

| | | | |
|---|---|---|---|
| 9,953,992 B1 | 4/2018 | Ogawa et al. | |
| 10,249,640 B2* | 4/2019 | Yu | ..... H01L 23/5283 |
| 10,504,918 B2 | 12/2019 | Shimojo et al. | |
| 2017/0179153 A1 | 6/2017 | Ogawa et al. | |

(Continued)

*Primary Examiner* — Jay C Kim
*Assistant Examiner* — Woo K Lee
(74) *Attorney, Agent, or Firm* — Fish & Richardson P.C.

(57) ABSTRACT

A semiconductor device includes circuit elements on a first substrate; gate electrodes on a second substrate and stacked to be apart from each other in a first direction; sacrificial insulating layers on a lower through-insulating layer penetrating the second substrate, stacked to be spaced apart from each other in the first direction, and having side surfaces opposing the gate electrodes; channel structures penetrating the gate electrodes, extending vertically on the second substrate, and including a channel layer; a first separation pattern penetrating the gate electrodes and including a first barrier pattern and a first pattern portion extending from the first barrier pattern in a second direction; and a second separation pattern penetrating the gate electrodes, disposed to be parallel to the first separation pattern, and extending in the second direction. Some of the side surfaces of the sacrificial insulating layers may overlap the first barrier pattern in a third direction.

10 Claims, 33 Drawing Sheets

(56) References Cited

U.S. PATENT DOCUMENTS

| | | |
|---|---|---|
| 2019/0067314 A1 | 2/2019 | Lu et al. |
| 2019/0139976 A1 | 5/2019 | Lee et al. |
| 2019/0237475 A1 | 8/2019 | Jung et al. |
| 2019/0237477 A1 | 8/2019 | Baek et al. |
| 2019/0341399 A1 | 11/2019 | Tao et al. |
| 2019/0393240 A1 | 12/2019 | Kim et al. |
| 2020/0365616 A1* | 11/2020 | Baek ................ H10B 43/50 |

* cited by examiner

SEMICONDUCTOR DEVICES

CROSS-REFERENCE TO RELATED APPLICATION

Korean Patent Application No. 10-2020-0096793, filed on Aug. 3, 2020, in the Korean Intellectual Property Office, and entitled: "Semiconductor Devices," is incorporated by reference herein in its entirety.

BACKGROUND

1. Field

The present disclosure relates generally to semiconductor devices.

2. Description of the Related Art

Contemporary semiconductor devices are increasingly desired to provide high-speed, advanced data processing capabilities while further reducing their already compact size. Accordingly, it is desired to continuously increase the integration density of constituent elements and components of semiconductor devices. One technique for increasing the integration density of semiconductor devices is to employ a vertical transistor structure, rather than a planar transistor structure.

SUMMARY

Embodiments are directed to a semiconductor device includes: a peripheral circuit region on a first substrate and including circuit elements; a stack structure provided on a second substrate disposed on the peripheral circuit region and including gate electrodes stacked to be spaced apart from each other in a first direction, perpendicular to an upper surface of the second substrate, on a first region of the second substrate and extending while having a staircase shape on a second direction, perpendicular to the first direction, in a second region of the second substrate and interlayer insulating layers stacked alternately with the gate electrode; a channel structure penetrating through the stack structure, extending vertically on the second substrate, and including a channel layer; a separation structure penetrating through the stack structure and extending in a second direction, and including a first separation pattern and a pair of second separation patterns disposed to be parallel to the first separation pattern; a through-region disposed between the pair of second separation patterns and including a lower through-insulating layer penetrating through the second substrate, and the interlayer insulating layers and sacrificial insulating layers sequentially stacked on the lower through-insulating layer; and through-contact plugs extending in the first direction through the through-region and electrically connected to the circuit elements of the peripheral circuit region. The sacrificial insulating layers have side surfaces opposing the gate electrodes. An end portion of the first separation pattern protrudes, further than at least some of the side surfaces of the sacrificial insulating layers, toward the through-region.

According to an example embodiment, a semiconductor device includes: circuit elements disposed on a first substrate; gate electrodes disposed on a second substrate on the circuit elements and stacked to be spaced apart from each other in a first direction perpendicular to an upper surface of the second substrate; sacrificial insulating layers disposed on a lower through-insulating layer penetrating through the second substrate, stacked to be spaced apart from each other in the first direction, and having side surfaces opposing the gate electrodes; channel structures penetrating through the gate electrodes, extending vertically on the second substrate, and including a channel layer; a first separation pattern penetrating through the gate electrodes and including a first barrier pattern and a first pattern portion extending from the first barrier pattern in a second direction, perpendicular to the first direction; and a second separation pattern penetrating through the gate electrodes, disposed to be parallel to the first separation pattern, and extending in the second direction. At least some of the side surfaces of the sacrificial insulating layers overlap the first barrier pattern in a third direction, perpendicular to the first and second directions.

According to an example embodiment, a semiconductor device include: circuit elements disposed on a first substrate; gate electrodes disposed on a second substrate on the circuit elements, stacked to be spaced apart from each other on a first region of the second substrate in a first direction perpendicular to an upper surface of the second substrate, and extending in a staircase shape on a second region of the second substrate in a second direction perpendicular to the first direction; channel structures penetrating through the gate electrodes, extending vertically on the second substrate, and including a channel layer; first barrier patterns and second barrier patterns penetrating through the gate electrodes on the second region of the second substrate; an insulating region including a lower through-insulating layer, penetrating through the second substrate in the second region of the second substrate, and sacrificial layers and intermediate insulating layers alternately stacked on the lower through-insulating layer; and through-contact plugs extending through the insulating region in the first direction and electrically connected to the circuit elements. The insulating region is disposed between second barrier patterns extending in parallel, the first barrier patterns are spaced apart from the second barrier pattern, and the sacrificial insulating layers of the insulating region are in direct contact with at least one of the first and second barrier patterns.

BRIEF DESCRIPTION OF DRAWINGS

Features will become apparent to those of skill in the art by describing in detail example embodiments with reference to the attached drawings in which.

DETAILED DESCRIPTION

Figure 1:
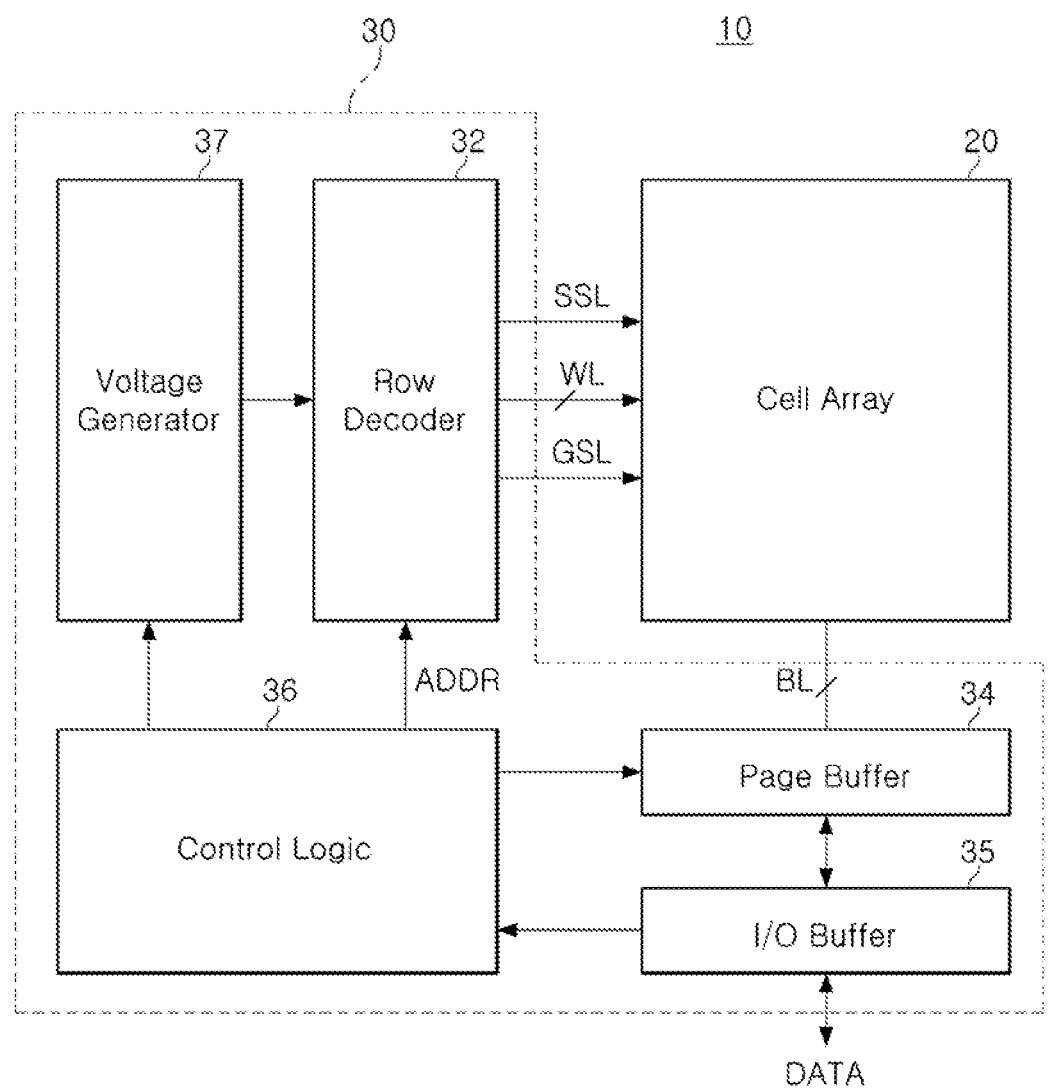
FIG. 1 is a schematic block diagram of a semiconductor device According to some example embodiments.

FIG. 1 is a schematic block diagram of a semiconductor device 10 According to some example embodiments.

Referring to FIG. 1, the semiconductor device 10 generally includes a memory cell array 20 and a peripheral circuit 30. The peripheral circuit 30 may include a row decoder 32, a page buffer 34, an input/output (I/O) buffer 35, a control logic 36, and a voltage generator 37.

The memory cell array 20 may include a plurality of memory blocks, and each of the memory blocks may include a plurality of memory cells. The plurality of memory cells may be connected to the row decoder 32 through a string select line SSL, wordlines WL, and a ground select line GSL, and may be connected to the page buffer 34 through bitlines BL. In example embodiments, a plurality of memory cells, arranged along the same row, may be connected to the same wordline WL, and a plurality of memory cells, arranged along the same column, may be connected to the same bitline BL.

The row decoder 32 may decode an input address ADDR to generate and transmit driving signal of a wordline WL. For example, the row decoder 32 may provide a wordline voltage WL, generated by the voltage generator 37 in response to control of the control logic 36, to a selected wordline WL and unselected wordlines WL.

The page buffer 34 may be connected to the memory cell array 20 through bitlines BL to read data stored in the memory cells. The page buffer 34 may be used to temporarily store write data to be stored in the memory cells or to sense data stored in the memory cells, depending on the operating mode of the semiconductor device 10. The page buffer 34 may include a column decoder and a sense amplifier. The column decoder may selectively activate the bitlines BL of the memory cell array 20, and the sense amplifier may sense a voltage on a bitline BL selected by the column decoder during a read operation to read data stored in a selected memory cell.

The I/O buffer 35 may receive data (DATA) during a program operation, and transmit the received data to the page buffer 34. The I/O buffer 35 may also output data (DATA), received from the page buffer 34, to an external entity during a read operation. The I/O buffer 35 may transmit an input address or instruction to the control logic 36.

The control logic 36 may control the overall operation of the row decoder 32 and the page buffer 34. The control logic 36 may receive a control signal and an external voltage transmitted from an external entity, and may operate depending on the received control signal. The control logic 36 may control read, write, and/or erase operations in response to the control signals.

The voltage generator 37 may generate voltages that are used for internal operations, such as a program voltage, a read voltage, an erase voltage, and the like, using an external voltage. A voltage generated by the voltage generator 37 may be transferred to the memory cell array 20 through the row decoder 32.

Figure 2:
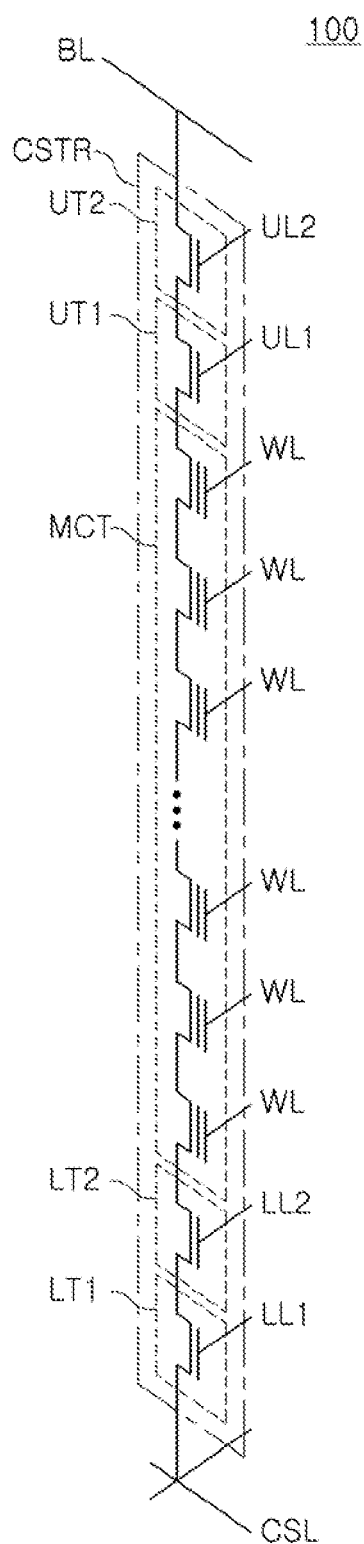
FIG. 2 is an equivalent circuit diagram of a cell array of a semiconductor device According to some example embodiments.

FIG. 2 is an equivalent circuit diagram of a cell array of a semiconductor device 100 According to some example embodiments.

Referring to FIG. 2, the semiconductor device 100 may include a bitline BL, a common source line CSL, wordlines WL, upper gate lines UL1 and UL2, lower gate lines LL1 and LL2, and a cell string CSTR between the bitline BL and the common source line CSL.

The cell string CSTR may include a single or plurality of lower transistors LT1 and LT2 adjacent to the common source line CSL, and a single or plurality of upper transistors UT1 and UT2 adjacent to the bitline BL, and a plurality of memory cell transistors MCT disposed between the single or plurality of lower transistors LT1 and LT2 and the single or plurality of upper transistors UT1 and UT2.

The single or plurality of lower transistors LT1 and LT2, the plurality of memory cell transistors MCT, and the single or plurality of upper transistors UT1 and UT2 may be connected in series.

In an example embodiment, the single or plurality of upper transistors UT1 and UT2 may include a string select transistor, and the single or plurality of lower transistors LT1 and LT2 may include a ground select transistor.

In an example embodiment, the single or plurality of lower transistors LT1 and LT2 may include a plurality of lower transistors, and the plurality of lower transistors LT1 and LT2 may include a lower erase control transistor LT1 and a ground select LT2 connected in series. The ground select transistor LT2 may be disposed on the lower erase control select transistor LT1.

In an example embodiment, the single or plurality of upper transistors UT1 and UT2 may include a plurality of upper transistors, and the plurality of upper transistors UT1 and UT2 may include a string select transistor UT1 and an upper erase control transistor UT2 connected in series. The upper erase control transistor UT2 may be disposed on the string select transistor UT1.

The lower gate lines LL1 and LL2 may include a first lower gate line LL1 and a second lower gate line LL2, and the upper gate lines UL1 and UL2 may include a first upper gate line UL1 and a second upper gate line UL2.

The first lower gate line LL1 may be a gate electrode of the lower erase transistor LT1, the second lower gate line LL2 may be a gate electrode of the ground select transistor LT1, the wordlines WL may be gate electrodes of the memory cell transistors MCT, the first upper gate line UL1 may be a gate electrode of the string select transistor UT1, and the second upper gate line UL2 may be a gate electrode of the upper erase transistor UT2.

An erase operation for erasing data stored in the memory cell transistors MCT may be performed using gate induced drain leakage (GIDL) occurring in the upper and lower erase transistors LT1 and UT2. For example, holes generated in the upper and lower erase transistors LT1 and UT2 by gate induced drain leakage (GIDL) may be injected into channels of the memory cell transistors MCT, and data of the memory cell transistors MCT may be erased by the holes injected into the channels of the memory cell transistors MCT. For example, the holes injected into the channels of the memory cell transistors MCT may allow electrons, trapped in a data storage layer of the memory cell transistors MCT, to migrate to the channels of the memory cell transistors MCT.

Figure 3:
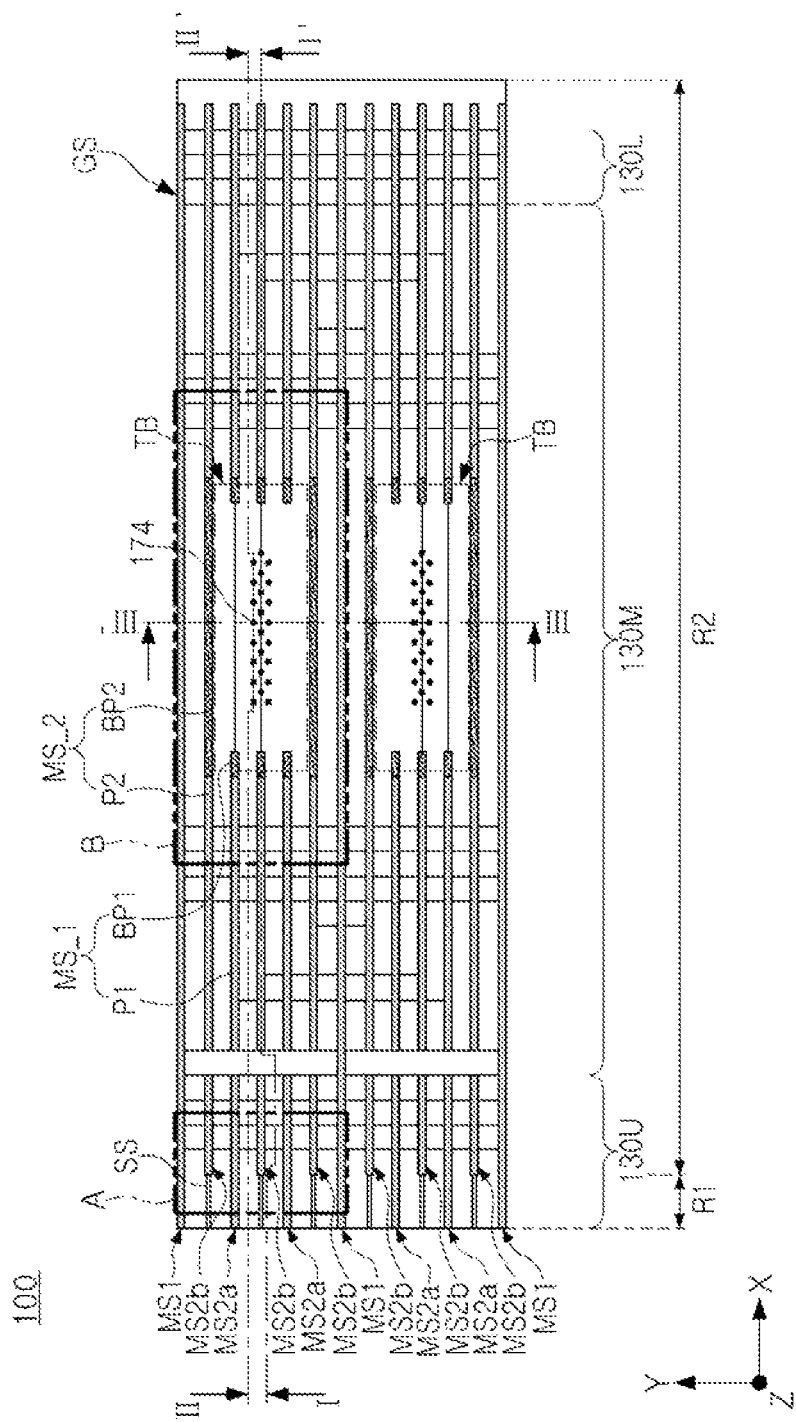
FIGS. 3 and 4 are schematic plan views of a semiconductor device According to some example embodiments.

FIG. 3 is a schematic plan view of a semiconductor device According to some example embodiments. For clarity, FIG. 3 illustrates only some elements of the semiconductor device According to some example embodiments.

Figure 4:
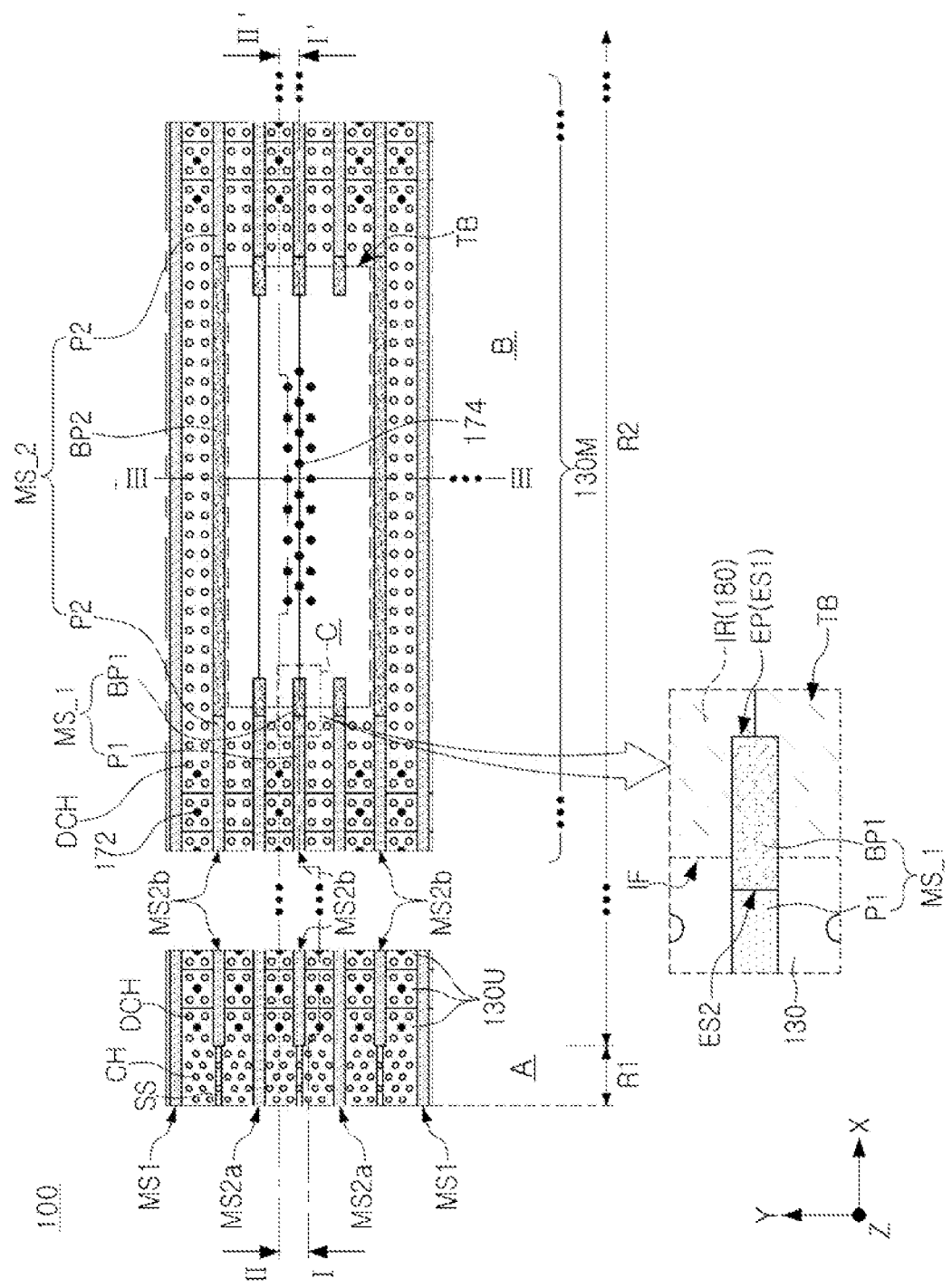

FIG. 4 is a schematic partially-enlarged view of a semiconductor device According to some example embodiments. FIG. 4 is an enlarged view of regions "A" and "B" in FIG. 3.

Figure 5A:
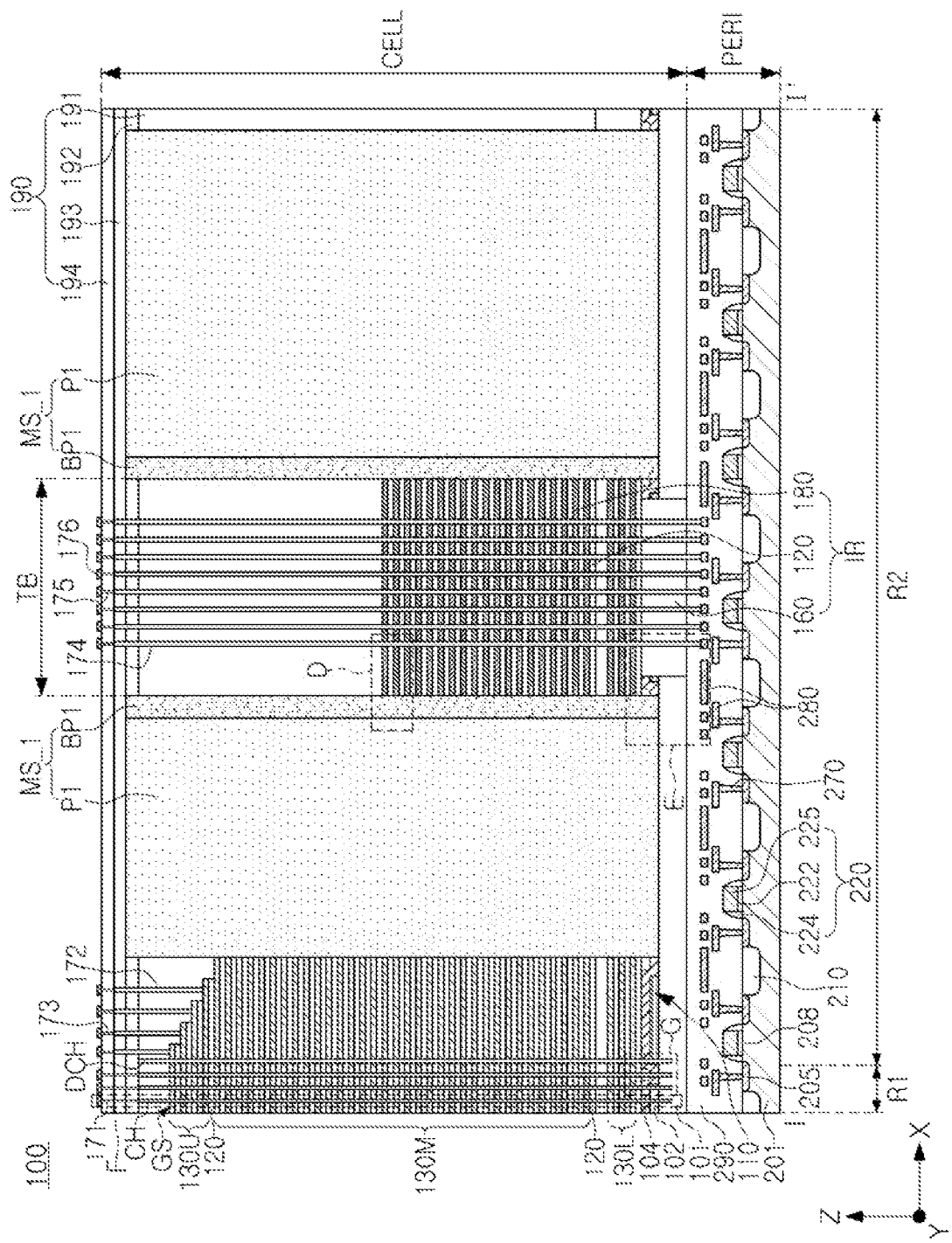
FIGS. 5A, 5B, and 5C are schematic cross-sectional views of a semiconductor device According to some example embodiments.
Figure 5B:
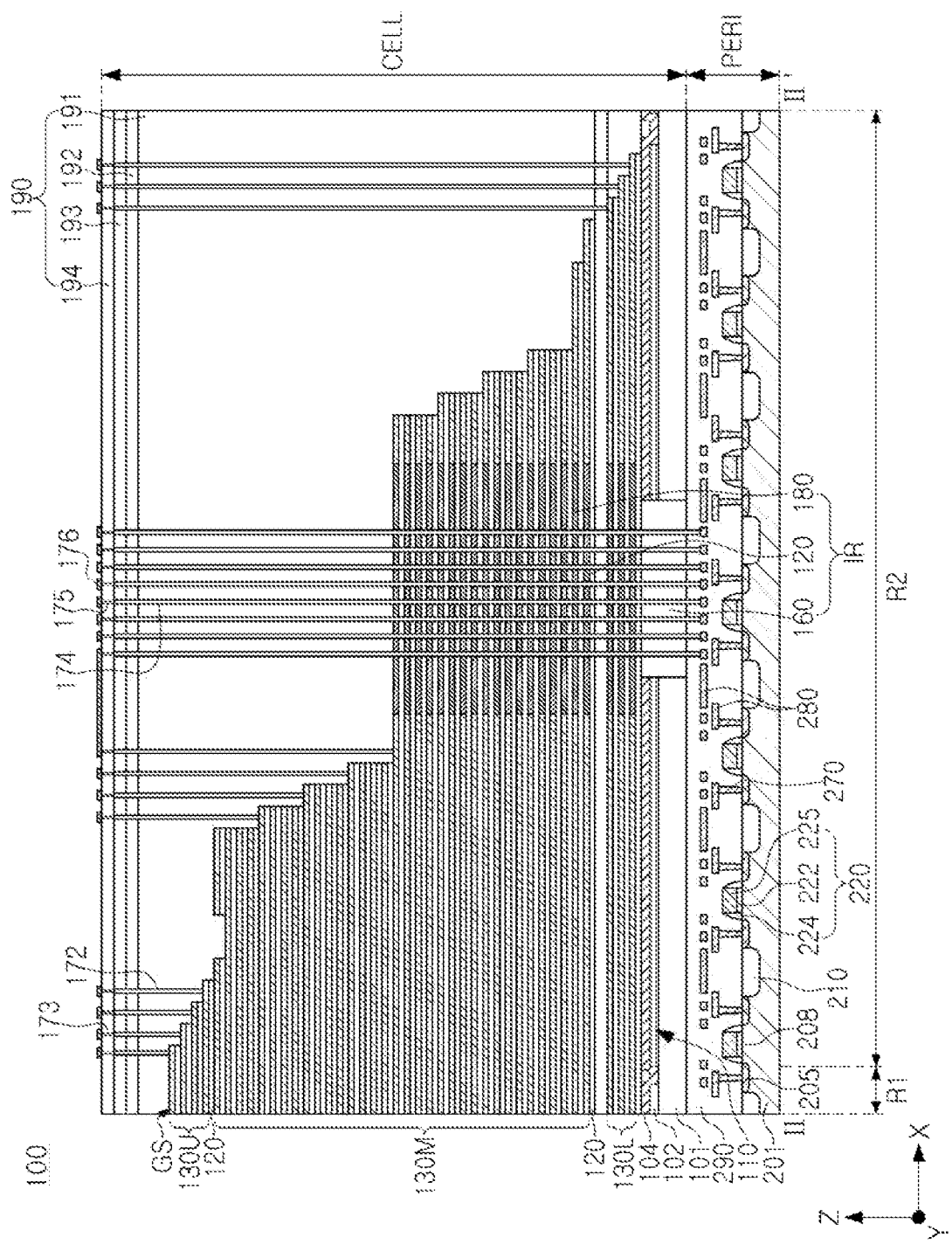
Figure 5C:
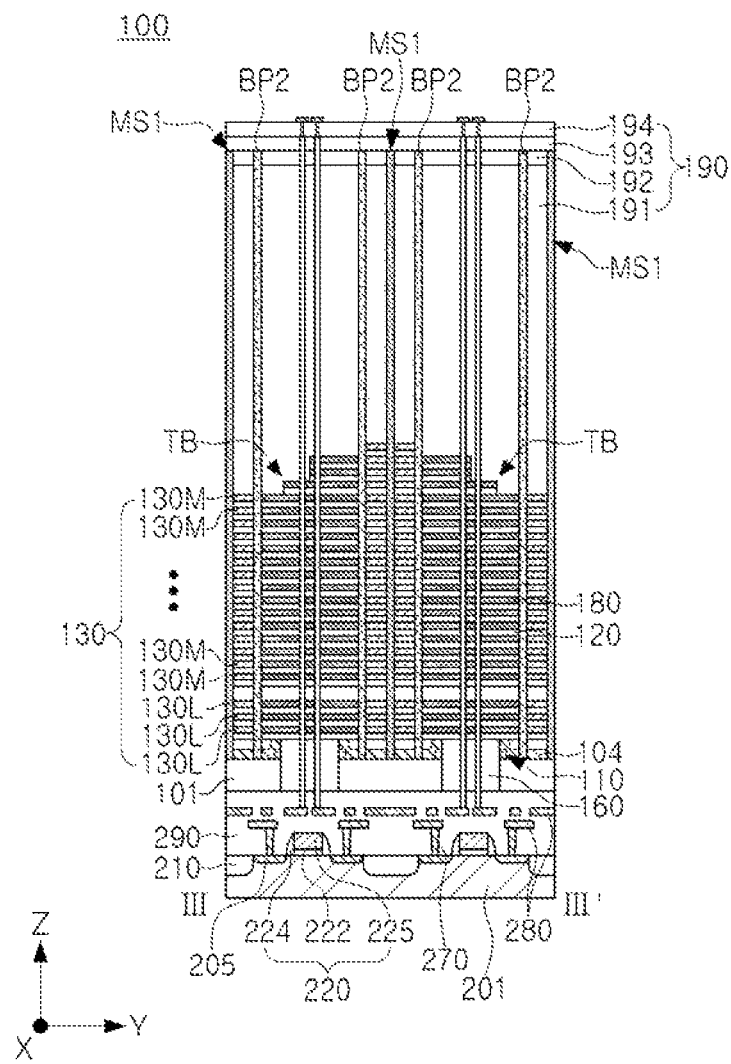

FIGS. 5A, 5B, and 5C are schematic cross-sectional views of a semiconductor device According to some example embodiments. FIGS. 5A, 5B, and 5C are cross-sections taken along lines I-I', II-II', and III-III' in FIG. 3, respectively.

FIGS. 6A, 6B, 6C, and 6D are schematic partially-enlarged cross-sectional views of a semiconductor device According to some example embodiments. FIGS. 6A, 6B, 6C, and 6D are enlarged views of regions "D", "E", "F", and "G" in FIG. 5A, respectively.

Referring to FIGS. 3 to 6C, a semiconductor device 100 may include a memory cell region CELL and a peripheral circuit region PERI. The memory cell region CELL may be disposed above the peripheral circuit region PERI. Alternatively, in an example embodiment, the memory cell region CELL may be disposed below the peripheral circuit region PERI.

The memory cell region CELL may include a substrate 101 having a first region R1 and a second region R2, a stack structure GS including interlayer insulating layers 120 and gate electrodes 130 alternately stacked on the substrate 101, separation structures MS1, MS2a, and MS2b extending through the stack structure GS, a through-region TB connected to the peripheral circuit region PERI through the stack structure GS and the substrate 101, upper separation regions SS penetrating through a portion of the stack structure GS, and channel structures CH disposed to penetrate through the stack structure GS. The memory cell region CELL may further include gate contact plugs 172, through-contact plugs 174, interconnection lines 176, dummy channel structures DCH, and a capping insulating layer 190.

The first region R1 of the substrate 101 may be a region in which the gate electrodes 130 are vertically stacked and the channel structures CH are disposed, and may correspond to the cell array 20 in FIG. 1. The second region R2 may be a region in which the gate electrodes 130 extend by different lengths, and may correspond to a region for electrically connecting the memory cell array 20 and the peripheral circuit 30 in FIG. 1 to each other. The second region R2 may be disposed on at least one end of the first region R1 in at least one direction, for example, in an X direction. The first region R1 may be referred to as a "memory cell array region," and the second region R2 may be referred to as a "connection region" or a "staircase region."

The substrate 101 may have an upper surface extending in the X direction and a Y direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as an epitaxial layer. The substrate 101 may be disposed on the peripheral circuit region PERI. The substrate of the peripheral circuit region PERI may be referred to as a "first substrate," and the substrate of the memory cell region CELL may be referred to as a "second substrate."

As illustrated in FIGS. 5A and 5B, the gate electrodes 130 of the stack structure GS may include a single or plurality of lower gate electrodes 130L, and a plurality of intermediate gate electrodes 130M, and a single or plurality of upper gate electrodes 130U on the substrate 101.

The single or plurality of lower gate electrodes 130L may include a gate electrode of the ground select transistor and/or a gate electrode of the lower erase control transistor in FIG. 2. The single or plurality of upper gate electrodes 130U may include a gate electrode of the string select transistor and/or a gate electrode of the upper erase control transistor in FIG. 2. The plurality of intermediate gate electrodes 130M may be gate electrodes of the memory cell transistors MCT in FIG. 2. The number of the plurality of intermediate gate electrodes 130M may be determined depending on capacity of the semiconductor device 100. Among the plurality of intermediate gate electrodes 130M, some overlying or underlying gate electrodes may be dummy gate electrodes.

The gate electrodes 130 may be vertically stacked on the first region R1 to be spaced apart from each other, and may extend from the first region R1 to the second region R2 by different lengths to form a staircase-like step. As illustrated in FIG. 5B, the gate electrodes 130 may be disposed have a step in the X direction. In addition, as illustrated in FIG. 5B, the gate electrodes 130 may be disposed to have a step in the Y direction. Due to the step, the underlying gate electrode 130 may extend further than the overlying gate electrode 130 to provide pad regions exposed upwardly of the gate electrodes 130. The gate electrodes 130 may be connected to gate contact plugs 172 in the pad regions to be connected to interconnection lines 176 disposed thereon.

The gate electrodes 130 may be disposed to be apart from each other in the Y direction by a first separation region MS1 extending in the X direction, as shown in FIG. 3. The gate electrodes 130 between a pair of first separation regions MS1 may constitute a single memory block, but the range of the memory block may be varied. Some of the gate electrodes 130, for example, the intermediate gate electrodes 130M may constitute a single layer in the single memory block.

The gate electrodes 130 may include a metallic material, for example, tungsten (W). According to an example embodiment, the gate electrodes 130 may include polycrystalline silicon or a metal silicide material. In example embodiments, the gate electrodes 130 may further include a diffusion barrier. For example, the diffusion barrier may include a tungsten nitride (WN), a tantalum nitride (TaN), a titanium nitride (TiN), or combinations thereof.

The interlayer insulating layers 120 of the stack structure GS may be disposed between the gate electrodes 130. Similarly to the gate electrodes 130, the interlayer insulating layers 120 may be disposed to be spaced apart from each other in a direction, perpendicular to the upper surface of the substrate 101, and to extend in the X direction. The interlayer insulating layers 120 may include an insulating material such as a silicon oxide or a silicon nitride.

Separation structures MS1, MS2a, and MS2b may be disposed to extend in the X direction through the stack structure GS on the first region R1 and the second region R2. The separation structures MS1, MS2a, and MS2b may be disposed parallel to each other. The separation structures MS1, MS2a, and MS2b may be connected to the substrate 101 through the entire gate electrodes 130 stacked on the substrate 101.

The separation structures MS1, MS2a, and MS2b may include first separation regions MS1 and second separation regions MS2a and MS2b. The first separation regions MS1 may extend along the first region R1 and the second region R2 as a single region. The second separation regions MS2b may intermittently extend or may only be disposed in some regions.

The second separation regions MS2a and MS2b may include second main separation regions, extending from the first region R1 to a portion of the second region R2 as a single region, and second auxiliary separation regions MS2b intermittently extending from the second region R2. The second main separation regions MS2a may be separated by a given interval in the X direction on the second region R2 to be disposed as a plurality of second main separation regions. The second auxiliary separation regions MS2b may only be disposed on the second region R2, and may be separated at given intervals in the X direction to be disposed as a plurality of second auxiliary separation regions. However, in example embodiments, an arrangement order, the number, and the like, of the first and second separation regions MS1, MS2a, and MS2b may be varied relative to those illustrated in FIG. 3.

The first and second separation regions MS1, MS2a, and MS2b may have a shape in which a width is decreased in a direction toward the substrate 101 due to a high aspect ratio. However, in another example embodiment, each of the first and second separation regions MS1, MS2a, and MS2b may have a side surface that is perpendicular to an upper surface of the substrate 101.

Each of the first and second separation regions MS1, MS2a, and MS2b may be formed of an insulating material. For example, each of the first and second separation regions MS1, MS2a, and MS2b may include an insulating material such as a silicon oxide, a silicon nitride, or the like.

The second separation regions MS2a and MS2b may include a first separation pattern MS_1 and a pair of second separation patterns MS_2 disposed between the first separation regions MS1 in parallel. The first separation pattern MS_1 may be disposed between a pair of second separation patterns MS_2. A through-region TB, including an insulating region IR, may be defined on a second region R2 of the substrate 101 by the first and second separation patterns MS_1 and MS_2.

The insulating region IR of the through-region TB may include a lower through-insulating layer 160, and interlayer insulating layers 120 and sacrificial insulating layers 180, alternately stacked on the lower through-insulating layer 160, on the second region R2. The through-region TB may include an interconnection structure for electrically connecting the memory cell region CELL and the peripheral circuit region PERI to each other. The through-region TB may be disposed on the second region R2. For example, a single through-region TB may be disposed per one or more memory blocks.

Figure 6A:
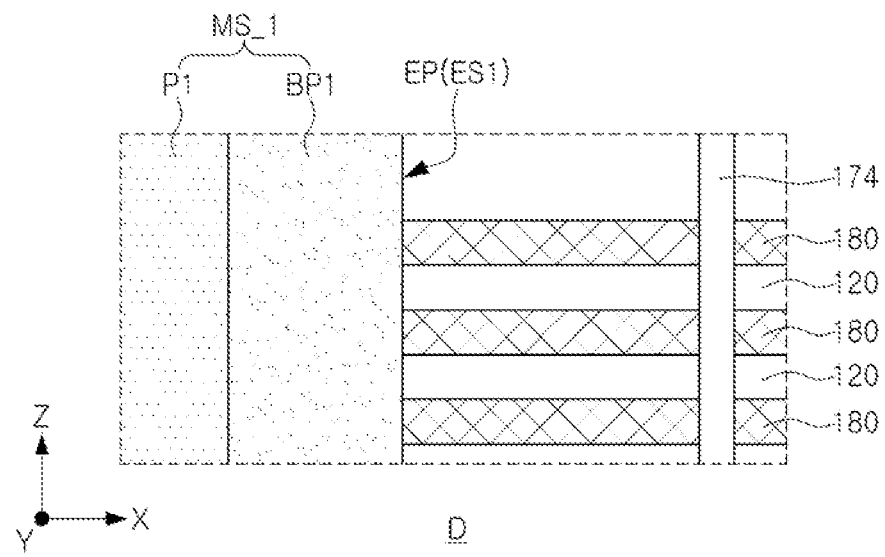
FIGS. 6A, 6B, 6C, and 6D are schematic partially-enlarged cross-sectional views of semiconductor devices According to some example embodiments.
Figure 6B:
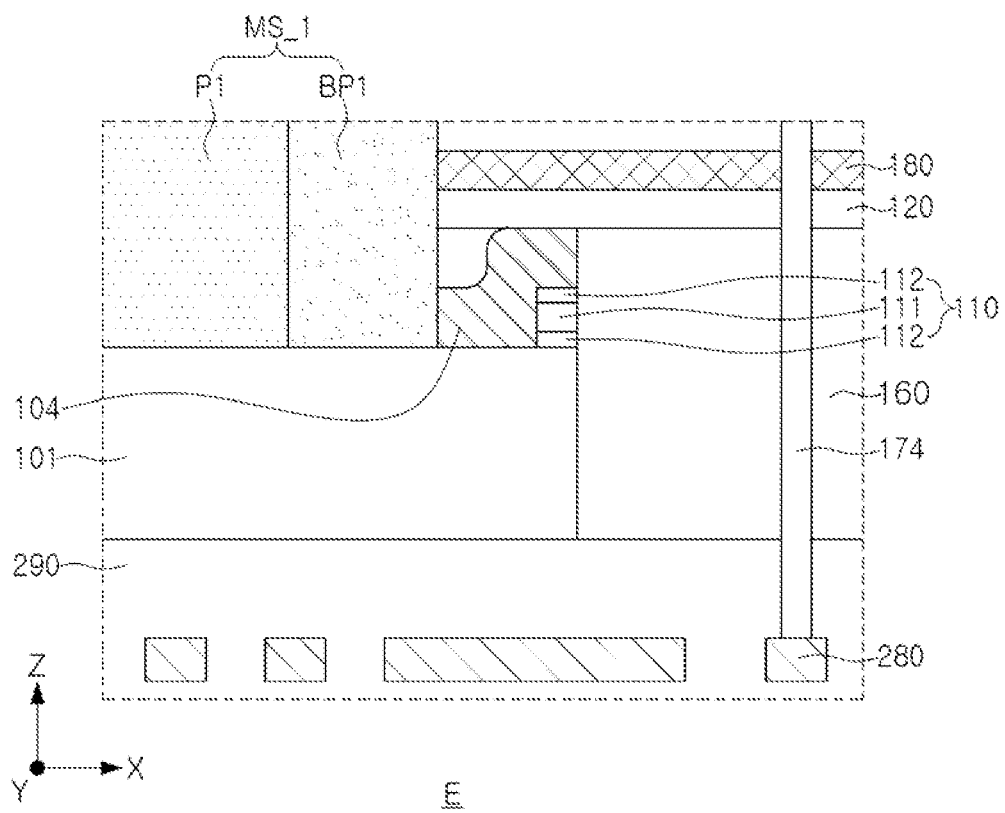

The lower through-insulating layer 160 may be disposed in a region, in which a portion of the substrate 101 is removed, to be surrounded by the substrate 101. The lower through-insulating layer 160 may be disposed to penetrate through lower sacrificial layers 110 including first and second horizontal sacrificial layers 111 and 112, as illustrated in FIG. 6B. The lower through-insulating layer 160 may be disposed to penetrate through a second horizontal conductive layer 104.

The interlayer insulating layers 120 may form the insulating region IR in the through-region TB, while constituting the stacked structure GS together with the gate electrodes 130.

The sacrificial insulating layers 180 may be disposed on substantially the same level as the gate electrodes 130, and may be disposed such that side surfaces of the sacrificial insulating layers 180 are in contact with the gate electrodes 130 on a boundary of the through-region TB.

The lower through-insulating layer 160, the interlayer insulating layers 120, and the sacrificial insulating layers 180, constituting the insulating region IR, may be formed of an insulating material. For example, each of the lower through-insulating layer 160, the interlayer insulating layers 120, and the sacrificial insulating layers 180 may include a silicon oxide, a silicon nitride, or a silicon oxynitride. For example, even when some of the lower through-insulating layer 160, interlayer insulating layers 120, and sacrificial insulating layers 180 are formed of the same material, physical properties may be different depending on a formation process, a composition, and the like. Accordingly, boundaries may be distinguished from each other. The lower through-insulating layer 160 and the sacrificial insulating layers 180 may have the same width or different widths.

The through-region TB may be disposed to be in contact with the first separation pattern MS_1, as illustrated in FIGS. 4 and 5A.

The first separation pattern MS_1 may be disposed such that an end portion EP of the first separation pattern MS_1 protrudes toward the through-region TB, as illustrated in the enlarged view of region "C" in FIG. 4. The end portion EP of the first separation pattern MS_1 may protrude further than the boundary of the through-region TB. The boundary of the through-region TB may be an interface IF between the sacrificial insulating layers 180 and the gate electrodes 130.

The end portion EP of the first separation pattern MS_1 may protrude toward the through-region TB further than side surfaces, on which the sacrificial insulating layers 180 oppose the gate electrodes 130, or side surfaces on which the gate electrodes 130 oppose the sacrificial insulating layers 180. In an example embodiment, the end portion EP may protrude toward the through-region TB further than at least a portion of the interfaces IF or the side surfaces. As illustrated in FIG. 5A or 6A, the end portion EP may be in direct contact with the sacrificial insulating layers 180 and/or the interlayer insulating layers 120.

The first separation pattern MS_1 may include a first barrier pattern BP1, having the end portion EP of the first separation pattern MS_1, and a first pattern portion P1, extending from the first barrier pattern BP1 in the X direction, as illustrated in the enlarged view of region "C" in FIG. 4 or FIG. 5A. The first pattern portion P1 may be in direct contact with the first barrier pattern BP1.

The first barrier pattern BP1 may have a first end surface ES1 including an end portion of the first separation pattern MS_1. The first end surface ES1 may be in contact with the sacrificial insulating layers 180 and/or the interlayer insulating layers 120 in the through-region TB. The first barrier pattern BP1 may have a second end surface ES2 opposite to the first end surface ES1. The second end surface ES2 may be in contact with the first pattern portion P1. The first barrier pattern BP1 may vertically penetrate through the gate electrodes 130 on the second region R2.

The first barrier pattern BP1 may overlap the interfaces IF in the Y direction, as illustrated in the enlarged view of region "C" in FIG. 4. The first barrier pattern BP1 may overlap at least a portion of side surfaces of the sacrificial insulating layers 180 facing the gate electrodes 130 in the Y direction. A plurality of first separation patterns MS_1, including the first barrier pattern BP1, may be disposed on both sides of the through-region TB in the X direction.

The first barrier pattern BP1 may include a material that is different from a material of the sacrificial insulating layers 180. The first barrier pattern BP1 may include a material that is different from a material of the first pattern portion P1. For example, the first barrier pattern BP1 may include an insulating material such as a silicon oxide, a silicon nitride, or a silicon oxynitride, or a semiconductor material such as silicon, germanium, or the like. For example, the first pattern portion P1 may be formed of a material that is different from the material of the first barrier pattern BP1, among insulating materials such as a silicon oxide, a silicon nitride, a silicon oxynitride, or the like. In an example embodiment, the first barrier pattern BP1 and the first pattern portion P1 may be formed of the same material.

Figure 13A:
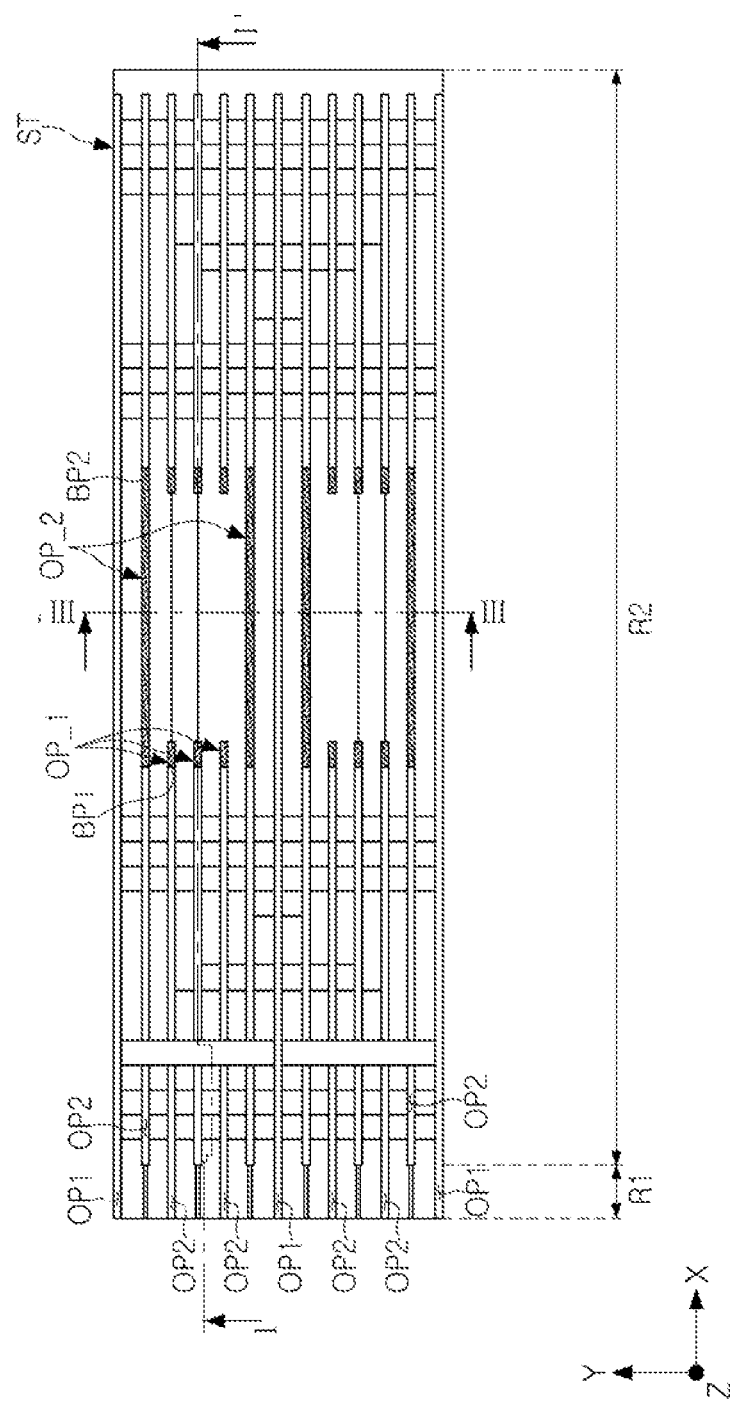
Figure 13B:
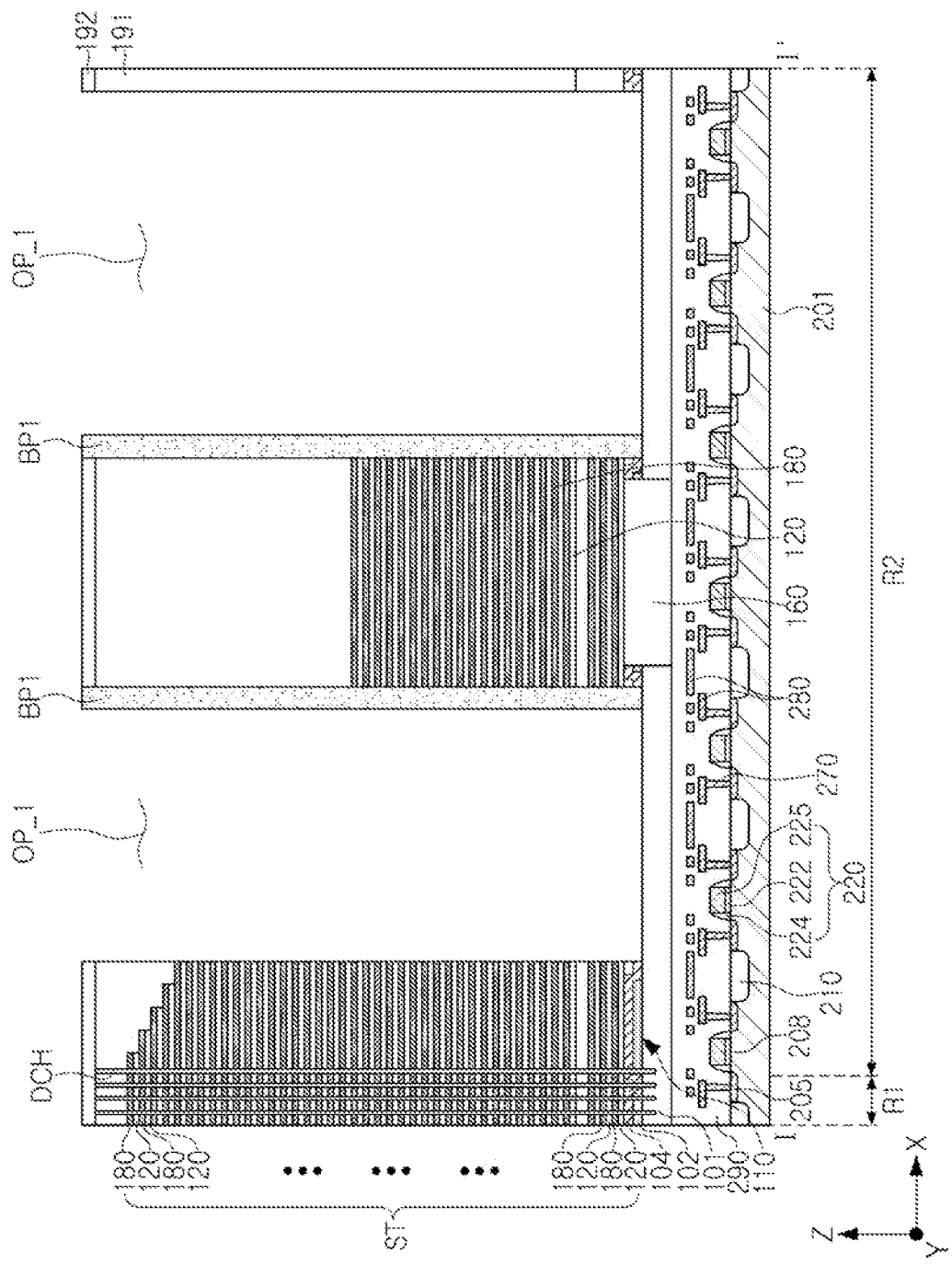
Figure 13C:
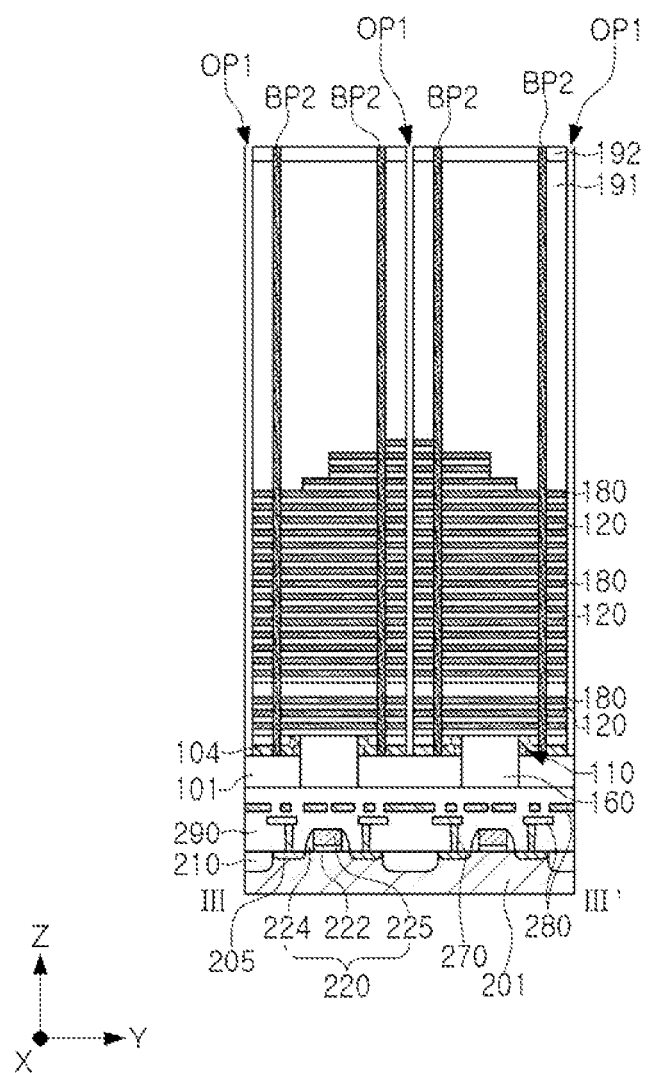

The first barrier pattern BP1 is formed in an opening pattern (see 'OP_1' in FIG. 13A) to control the flow of or diffusion of an etchant from the opening pattern to the through-region TB. For example, the first barrier pattern BP1 may serve to block the etchant. Since the first barrier pattern BP1 serves to block the etchant, the end portion EP of the first barrier pattern BP1 may be formed to protrude further than the interfaces IF.

As illustrated in FIGS. 4 and 5C, the through-region TB may be disposed between second barrier patterns BP2 of a pair of second separation patterns MS_2 on the second region R2. The insulating region IR may be defined between the second barrier patterns BP2 extending in parallel. The through-region TB may be disposed to be in contact with a portion of side surfaces of the pair of second separation patterns MS_2. Some of the side surfaces of the second separation patterns MS_2 may be in direct contact with the sacrificial insulating layers 180 and/or the interlayer insulating layers 120 in the insulating region IR.

Each of the second separation patterns MS_2 may include a second barrier pattern BP2, including a portion of a side surface of the second separation pattern MS_2, and second pattern portions P2 extending in the X direction from both end portions of the second barrier pattern BP2 in the X direction. The second pattern portions P2 may be in direct contact with both end portions of the second barrier pattern BP2.

The second barrier pattern BP2 may include a material that is different from a material of the sacrificial insulating layers 180. The second barrier pattern BP2 may include a material that is different from a material of the second pattern portions P2. In example embodiments, the second barrier pattern BP2 may be formed of the same material as the first barrier pattern BP1, or may be formed of a material that is different from a material of the first barrier pattern BP1. The second barrier pattern BP2 may be spaced apart from the first barrier pattern BP1. The second barrier pattern BP2 may have a greater length than the first barrier pattern BP1 in the X direction. The second barrier pattern BP2 may vertically penetrate through the gate electrodes 130 on the second region R2.

The second barrier pattern BP2 may serve to block flow or diffusion of the etchant from an opening pattern (see 'OP_2' in FIG. 13A) to the through-region TB. Thus, some of the sacrificial insulating layers 180 may not be removed and may remain between the pair of second barrier patterns BP2 to form a through-region TB including the insulating region IR.

If the first barrier pattern BP1 is not provided, the sacrificial insulating layers 180 may be removed from an end point of an opening pattern, in which the first separation pattern MS_1 is to be formed, to form a boundary of the through-region TB. A conductive material (for example, tungsten) may be used to fill a region in which the sacrificial insulating layers 180 are removed from the end point of the opening pattern, and a horizontal distance in the X direction, at which the conductive material is to fill the region, may be relatively large. Therefore, the conductive material may insufficiently fill the region in which the sacrificial insulating layers 180 are removed.

According to the example embodiment of the present disclosure, the first barrier pattern BP1 may be disposed in the opening pattern to include the end portion EP1 of the first separation pattern MS_1. Thus, an etchant used to remove the sacrificial insulating layers 180 may be blocked within a predetermined distance from the first barrier pattern BP1. The horizontal distance in the X direction, at which the conductive material is to fill the region, may be decreased and, as a result, an unfill issue (insufficient fill) of gate electrodes may be addressed, and a semiconductor device having improved electrical characteristics may be provided.

A horizontal distance in a Y direction, in which a conductive material is to fill a region in which the sacrificial insulating layers 180 are removed from an opening of the second separation pattern MS_2, may be decreased by the second barrier pattern BP2.

The first barrier pattern BP1 and the second barrier pattern BP2 may be disposed within the separation regions to improve electrical characteristics of the gate electrodes while securing the through-region TB.

The through-contact plugs 174 may extend through the stack structure GS and the substrate 101 in a Z direction in the through-region TB. The through-contact plugs 174 may penetrate through the insulating region IR. The insulating region IR may surround the through-contact plugs 174.

The through-contact plugs 174 may extend through the insulating region IR to be perpendicular to an upper surface of the substrate 101, and circuit elements 220 of the memory cell region CELL and the peripheral circuit region PERI may be electrically connected to each other. For example, the through-contact plugs 174 may electrically connect the gate electrodes 130 and the channel structures CH of the memory cell region CELL to the circuit elements 220 of the peripheral circuit region PERI. However, an interconnection structure electrically connecting the circuit elements 220 of the memory cell region CELL to the peripheral circuit region PERI may be varied relative to the through-contact plugs 174 in a through-interconnection region TB and, for example, an additional interconnection structure may be further disposed in a region outside the second region R2, or the like. The through-contact plugs 174 may be connected to an interconnection line 176 through additional contact plugs 175 provided thereabove. The through-contact plugs 170 may be connected to the circuit interconnection lines 280 provided therebelow.

The through-contact plugs 174 may penetrate through the interlayer insulating layers 120 and the sacrificial insulating layers 180 of the insulating region IR, and may penetrate through the insulating layer 160 provided therebelow. The number and shapes of the through-contact plugs 174, disposed through a single insulating region IR, may vary According to some example embodiments. According to some example embodiments, the through-contact plugs 174 may have a form in which plurality of layers are connected to each other. According to an example embodiment, in addition to the through-contact plugs 174, interconnection structures having an interconnection line form may be further disposed in the insulating region IR. The through-contact plugs 174 may include a conductive material, for example, tungsten (W), copper (Cu), aluminum (Al), or the like.

The interconnection line 176 may constitute an interconnection structure electrically connected to memory cells in the memory cell region CELL. The interconnection line 176 may be electrically connected to, for example, the gate electrodes 130 or the channel structures CH. The number of contact plugs and the interconnection lines, constituting the interconnection structure, may vary According to some example embodiments. The interconnection line 176 may include a metal, for example, tungsten (W), copper (Cu), aluminum (Al), or the like.

Upper separation regions SS may extend between first separation regions MS1 and the second main separation region MS2*a* in the X direction. The upper separation regions SS may be disposed to be parallel to a portion of the second main separation region MS2*a*. The upper separation regions SS may be disposed in a portion of the second region R2 and the first region R1 to penetrate through the single or plurality of upper gate electrodes 130U. For example, the upper separation regions SS may separate a total of four gate electrodes 130 from each other in the Y direction. However, the number of gate electrodes 130 separated by the upper separation regions SS may vary According to some example embodiments.

In example embodiments, the semiconductor device 100 may further include lower insulating layers that separate lower gate electrodes 130L, among the gate electrodes 130. For example, the lower insulating layer may be disposed to separate the lower gate electrodes 130L between the second main separation regions MS2*a* in a region in which the second main separation regions MS2*a* are disposed to be linearly spaced apart from each other in the X direction.

The channel structures CH may each constitute a single cell string CSTR (see FIG. 2), and may be disposed on the first region R1 to be spaced apart from each other while forming rows and columns. The channel structures CH may be disposed in a lattice form or in a zigzag pattern in one direction. The channel structures CH may have a pillar shape, and may have an inclined side surface in such a manner that a width thereof is decreased in a direction toward the substrate 101, depending on an aspect ratio.

Figure 6C:
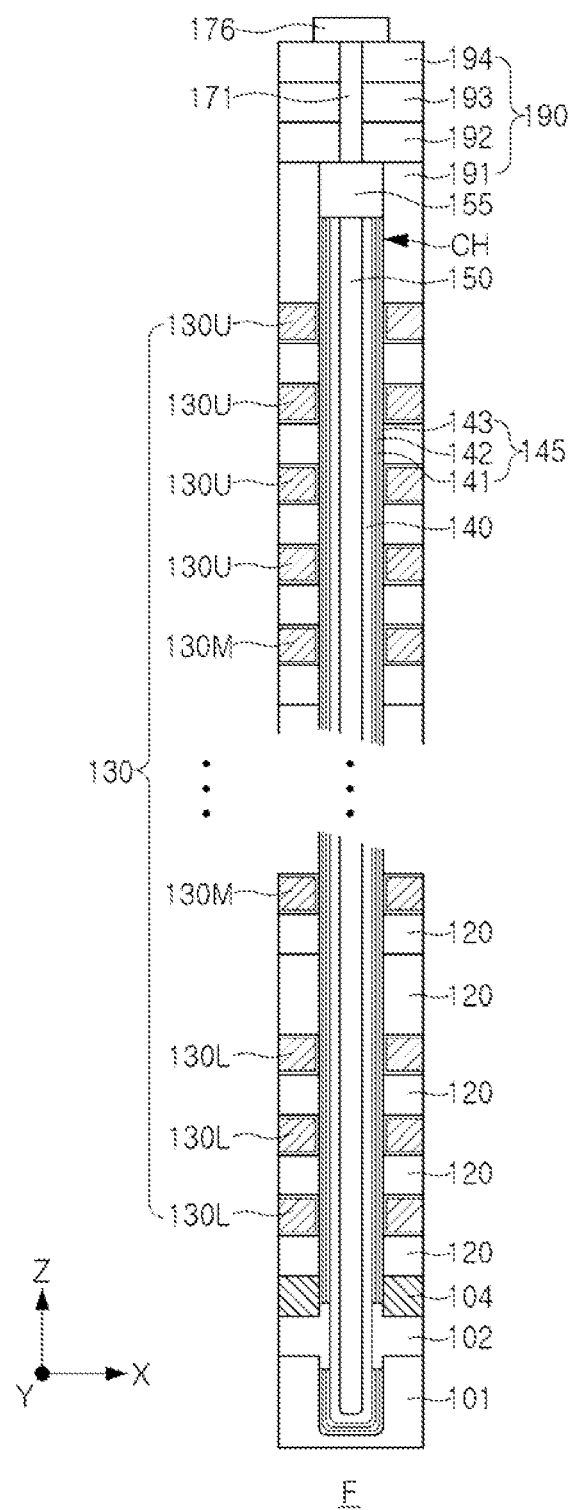

Referring to FIG. 6C, a channel layer 140 may be disposed in the channel structures CH. In the channel structures CH, the channel layer 140 may be annularly formed to surround the channel insulating layer 150 therein. In other example embodiments, the channel layer 140 may have a pillar shape such as a cylindrical or prismatic shape without the channel insulating layer 150. The channel layer 140 may be connected to a first horizontal conductive layer 102 provided therebelow. The channel layer 140 may include a semiconductor material such as polycrystalline silicon (hereinafter referred to as "polysilicon") or single-crystalline silicon. The channel structures CH, linearly disposed between the first or second separation regions MS1, MS2*a*, and MS2*b* and the upper separation region SS in the Y direction, may be respectively connected to different bitlines according to a disposition of the upper interconnection structure connected to channel pad 155. Channel contact plugs 171 may be disposed on the channel pads 155 to constitute an upper interconnection structure.

In the channel structures CH, the channel pads 155 may be disposed on the channel layer 140. The channel pads 155 may be disposed to cover an upper surface of the channel insulating layer 150 and to be electrically connected to the channel layer 140. The channel pads 155 may include, for example, doped polysilicon.

A gate dielectric layer 145 may be disposed between the gate electrodes 130 and the channel layer 140. The gate dielectric layer 145 may include a tunneling layer, a data storage layer, and a blocking layer stacked sequentially from the channel layer 140. The tunneling layer may tunnel electric charges to the data storage layer, and may include, for example, a silicon oxide ($SiO_2$), a silicon nitride ($Si_3N_4$), a silicon oxynitride (SiON), or combinations thereof. The blocking layer may include a silicon oxide ($SiO_2$), a silicon nitride ($Si_3N_4$), a silicon oxynitride (SiON), a high-k dielectric material, or combinations thereof.

Figure 6D:
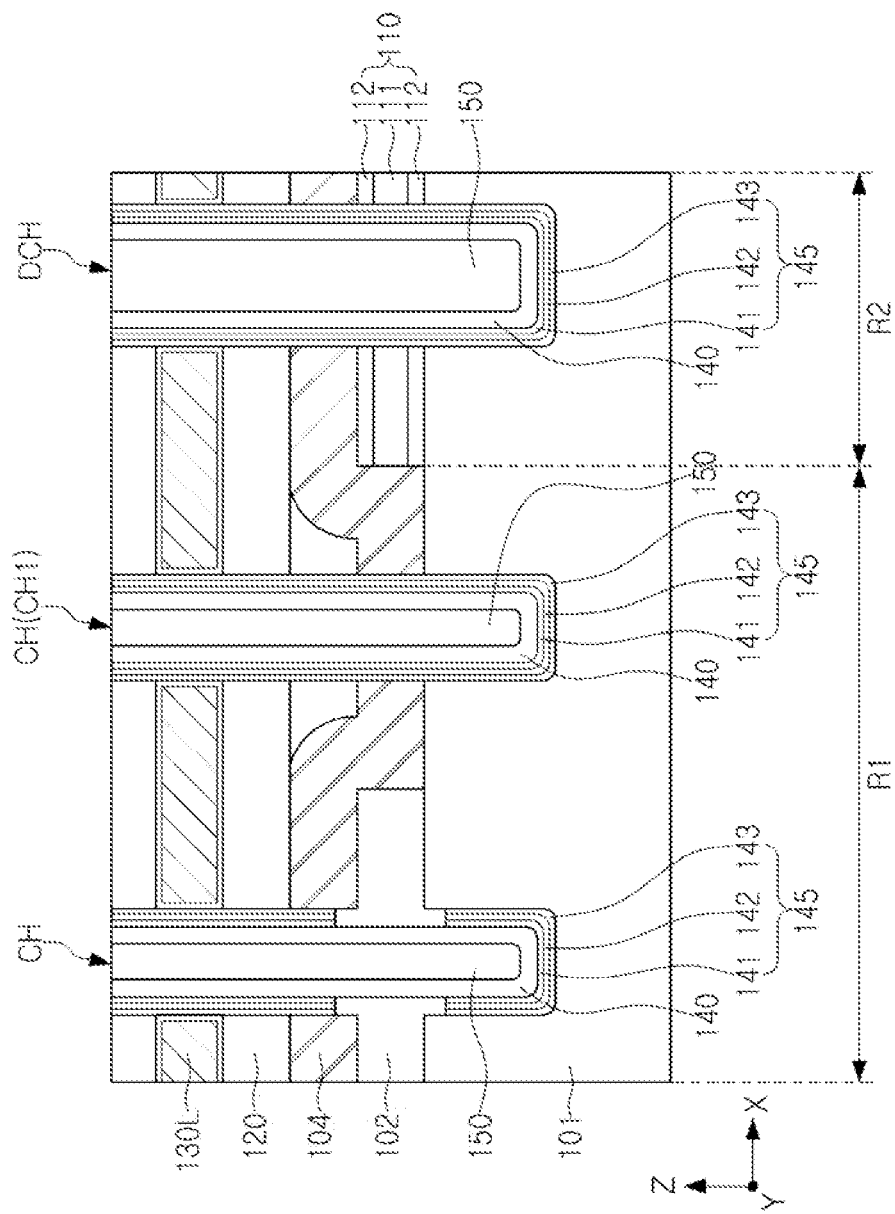

Dummy channel structures DCH may be disposed on the second region R2. The dummy channel structure DCH may have the same (or a similar) structure as the channel structures CH, but may not perform a substantial function in the semiconductor device 100. The dummy channel structures DCH may be disposed to be connected to the substrate 101 through a stack structure GS, a second horizontal conductive layer 104, and the first and second horizontal sacrificial layers 111 and 112, as illustrated in FIG. 6D. The dummy channel structures DCH may be regularly disposed in pad regions of the gate electrodes 130 while forming columns and rows. In an example embodiment, the dummy channel structures DCH may be disposed to penetrate through an insulating region IR of a through-region TB. As illustrated in FIG. 6D, the dummy channel structures DCH may have a size larger than a size (a maximum diameter) of the channel structures CH. As illustrated in FIG. 6D, among the channel structures CH, channel structures CH1 adjacent to the second region R2 may be dummy channels. The number and/or spacings of the dummy channel structures DCH may vary According to some example embodiments.

A capping insulating layer 190 may be disposed to cover the substrate 101 and the gate electrodes 130 of the stack structure GS. The capping insulating layer 190 may include a first insulating layer 191, a second insulating layer 192, a third insulating layer 193, and a fourth insulating layer 194 stacked sequentially. The capping insulating layer 190 may be formed of an insulating material.

The peripheral circuit region PERI may include a base substrate 201, and circuit elements 220, circuit contact plugs 270, and circuit interconnection lines 280 disposed on the base substrate 201.

The base substrate 201 may have an upper surface extending in the X direction and the Y directions. In the base substrate 201, additional separation layers 210 may be formed to define an active region 208. Source/drain regions 205, including impurities, may be disposed in a portion of the active region 208. The base substrate 201 may include a semiconductor material, for example, a group IV semiconductor, a group III-V compound semiconductor, or a group II-VI compound semiconductor.

The circuit elements 220 may include a horizontal transistor, which may include a circuit gate dielectric layer 222, a spacer layer 224, and a circuit gate electrode 225. Source/drain regions 205 may be disposed in the base substrate 201 on opposite sides adjacent to the circuit gate electrode 225.

A peripheral region insulating layer 290 may be disposed on the circuit element 220 on the base substrate 201. The circuit contact plugs 270 may be connected to the source/drain regions 205 through the peripheral insulating layer 290. An electric signal may be applied to the circuit element 220 by the circuit contact plugs 270. In a region not illustrated, the circuit contact plugs 270 may also be connected to the circuit gate electrode 225. Circuit interconnection lines 280 may be connected to the circuit contact plugs 270 and may be disposed as a plurality of layers.

Figure 7:
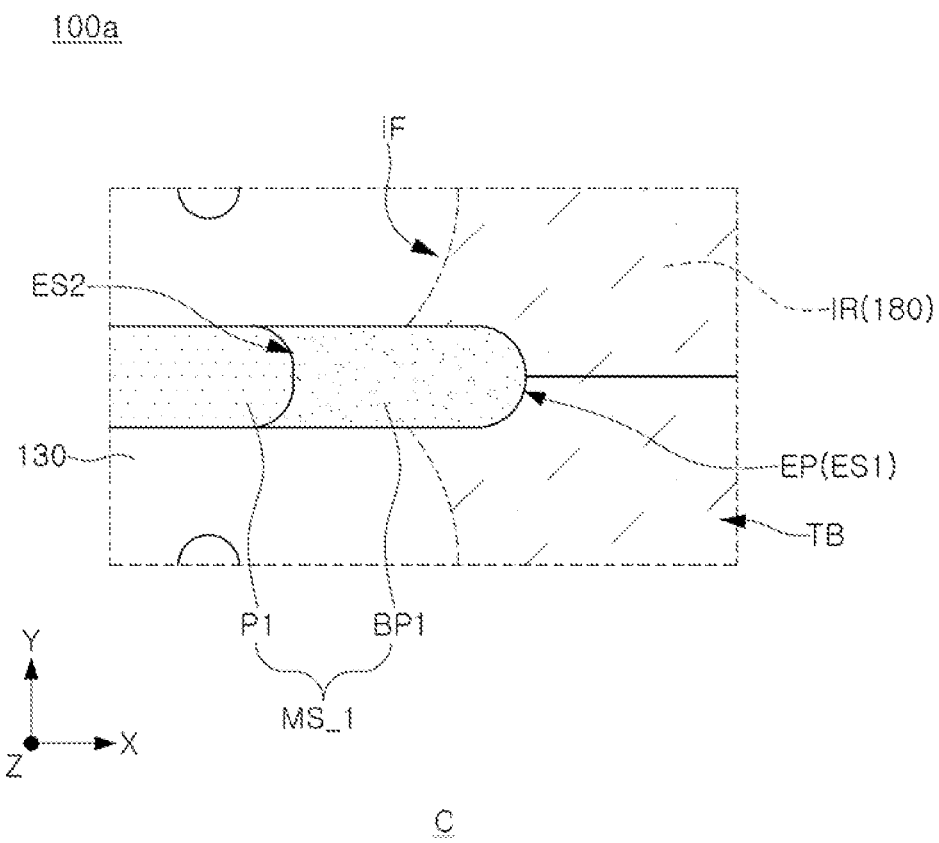
FIGS. 7, 8A, and 8B are schematic partially-enlarged plan views of semiconductor devices According to some example embodiments.

FIG. 7 is a schematic partially-enlarged plan view of a semiconductor device 100*a* According to some example embodiments. FIG. 7 is an enlarged view of a region corresponding to region "C" in FIG. 4.

Referring to FIG. 7, the semiconductor device 100*a* may include a first separation pattern MS_1 including a first barrier pattern BP1 and a first pattern portion P1. Shapes of the first barrier pattern BP1 and the first pattern portion P1 are schematically illustrated in FIG. 7. A first end surface ES1 of the first barrier pattern BP1 may be a curved surface that is convex toward sacrificial insulating layers 180 of a through-region TB. A width of the first barrier pattern BP1 in a Y direction may be decreased toward an end portion thereof. A second end surface ES2 of the first barrier pattern BP1 may be a curved surface that is concave toward the sacrificial insulating layers 180 of the through-region TB. An end surface of the first pattern portion P1 may be in contact with the second end surface ES2 and may be a convex, curved surface. Interfaces IF, formed by the gate electrodes 130 and the sacrificial insulating layers 180 of an insulating region IR, may have a curved region convex toward the through-region TB.

Figure 8A:
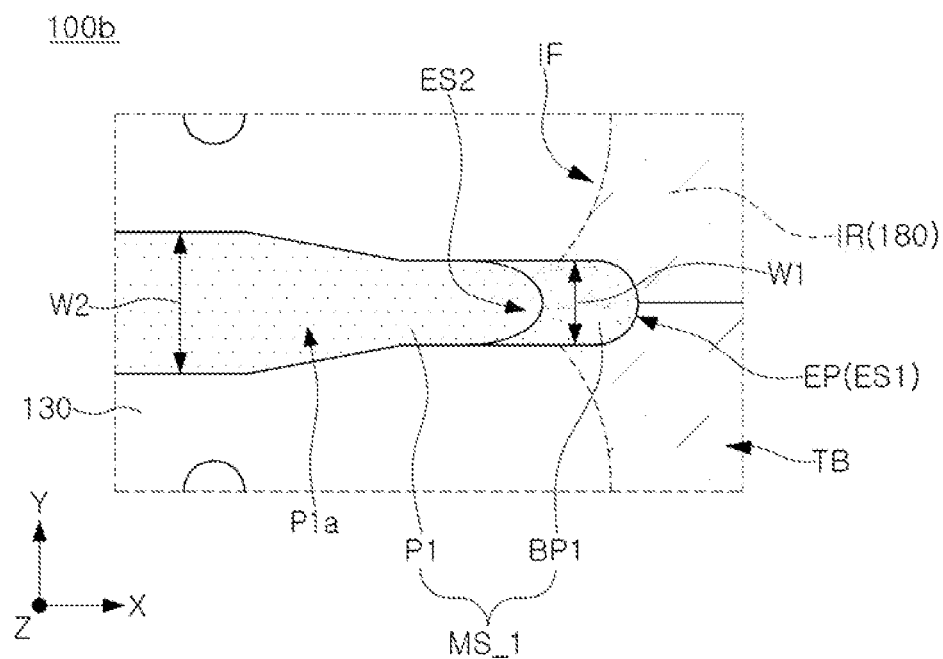

FIG. 8A is a schematic partially-enlarged plan view of a semiconductor device 100b According to some example embodiments. FIG. 8 is an enlarged view of a region corresponding to region "C" in FIG. 4.

Referring to FIG. 8A, the semiconductor device 100b may include a first separation pattern MS_1 including a first barrier pattern BP1 and a first pattern portion P1. Shapes of the first barrier pattern BP1 and the first pattern portion P1 are schematically illustrated in FIG. 8A. The first pattern portion P1 may include a portion P1a having a width, in a Y direction, that decreases toward the first barrier pattern BP1. A width W1 of the first barrier pattern BP1 in the Y direction may be smaller than a width W2 of the first pattern portion P1 in the Y direction, e.g., at a widest region of the portion P1a. A first end surface ES1 of the first barrier pattern BP1 may be a curved surface that is convex toward a sacrificial insulating layer 180 of a through-region TB, and a second end surface ES2 of the first barrier pattern BP1 may be a curved surface that is concave toward the sacrificial insulating layers 180. An end surface of the first pattern portion P1 may be in contact with the second end surface ES2, and may be a convex, curved surface.

A structure of the first separation pattern MS_1 in FIG. 8A may be obtained by forming an end portion of an opening of the first separation pattern MS_1 to have an intentionally narrowed region having a decreased width. After forming an insulating spacer layer to conformally cover an internal wall of the opening, a wet etching process may be performed to remove a portion of the insulating spacer layer. Accordingly, the insulating spacer layer may not be removed, and may remain in a region in which a width of the opening is decreased. This will be described below in detail with reference to FIGS. 16A to 16C.

Figure 8B:
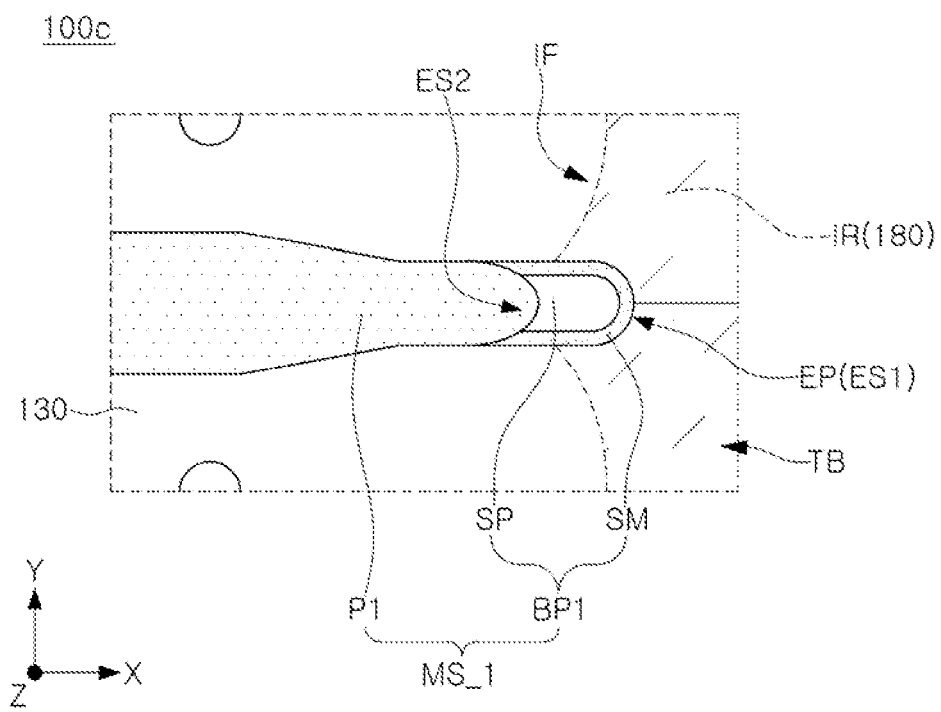

FIG. 8B is a schematic partially-enlarged plan view of a semiconductor device 100c According to some example embodiments. FIG. 8B is an enlarged view of a region corresponding to region "C" in FIG. 4.

Referring to FIG. 8B, the semiconductor device 100c may include a first separation pattern MS_1 and a first barrier pattern BP1. A structure of the first separation pattern MS_1 and the first barrier pattern BP1 are schematically illustrated in FIG. 8B. For example, as illustrated in FIG. 8B, the first barrier pattern BP1 may include an insulating spacer layer SP and a semiconductor layer SM disposed on a side surface of the insulating spacer layer SP. The insulating spacer layer SP may include an insulating material such as at least one of a silicon oxide, a silicon nitride, and silicon oxynitride. The insulating spacer layer SP may include a plurality of layers. The semiconductor layer SM may be formed of a semiconductor material such as silicon, germanium, or silicon-germanium. The semiconductor layer SM may be formed of polysilicon.

FIGS. 9A to 9G are schematic partially-enlarged plan views of semiconductor devices According to some example embodiments. Each of FIGS. 9A to 9H is an enlarged view of a region corresponding to region "B" in FIG. 3.

Figure 9A:
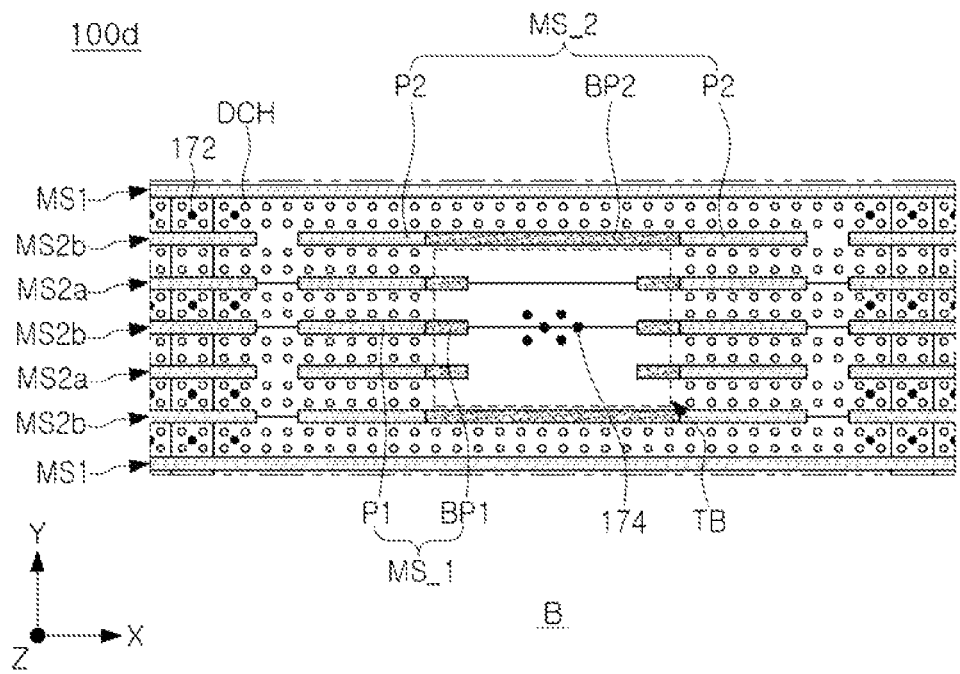
FIGS. 9A, 9B, 9C, 9D, 9E, 9F, and 9G are schematic plan views of semiconductor devices According to some example embodiments.

Referring to FIG. 9A, in a semiconductor device 100d, second separation regions MS2a and MS2b including first and second barrier patterns BP1 and BP2 may be separated by predetermined intervals in an X direction, to be disposed as a plurality of regions. For example, the first separation pattern MS_1 including the first barrier pattern BP1 and a first pattern portion P1 may be disposed to be spaced apart from other second separation regions MS2a and MS2b in the X direction.

Figure 9B:
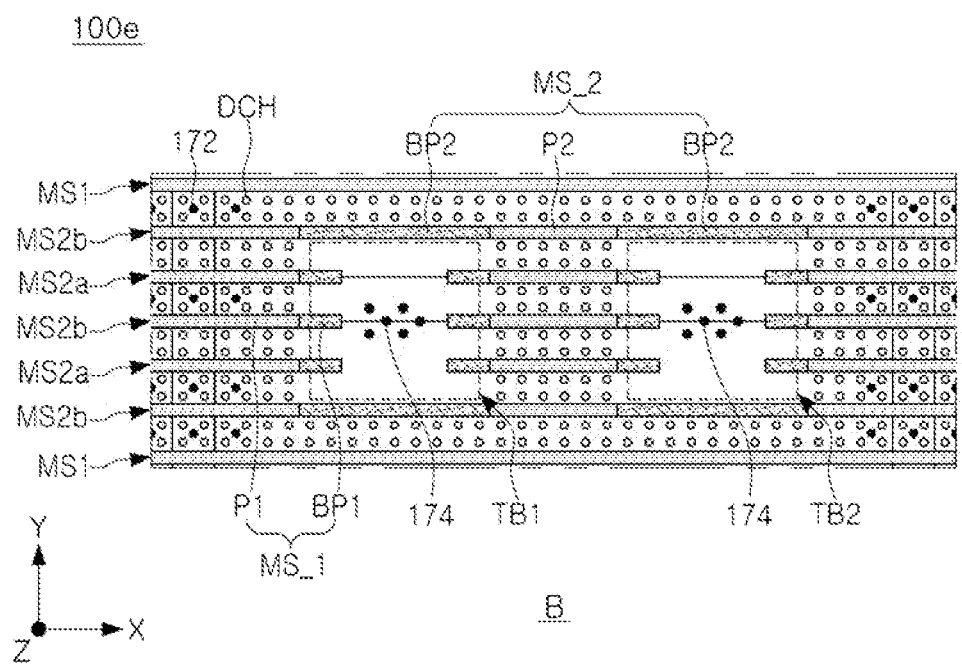

Referring to FIG. 9B, in a semiconductor device 100e, two through-regions TB1 and TB2 may be disposed between a pair of first separation regions MS1 that are spaced apart from each other in a Y direction. The through-regions TB1 and TB2 may include a first through-region TB1 and a second through-region TB2 spaced apart from each other in an X direction. Through-contact plugs 174 may be disposed in each of the first through-region TB1 and the second through-region TB2.

The first separation patterns MS_1 may be disposed apart from each other in the X direction as a plurality of first separation patterns MS_1. At least one of the plurality of first separation patterns MS_1 may include first barrier patterns BP1 spaced apart from each other on both end portions between the first through-region TB1 and the second through-region TB2. The first separation pattern MS_1 may include a first pattern portion P1 and first barrier patterns BP1, respectively being in contact with both end portions of the first pattern portion P1.

The second separation pattern MS_2 may include second barrier patterns BP2 spaced apart from each other in the X direction. In the second separation pattern MS_2, a second pattern portion P2 and a second barrier pattern BP2 may be alternately disposed in the X direction.

Figure 9C:
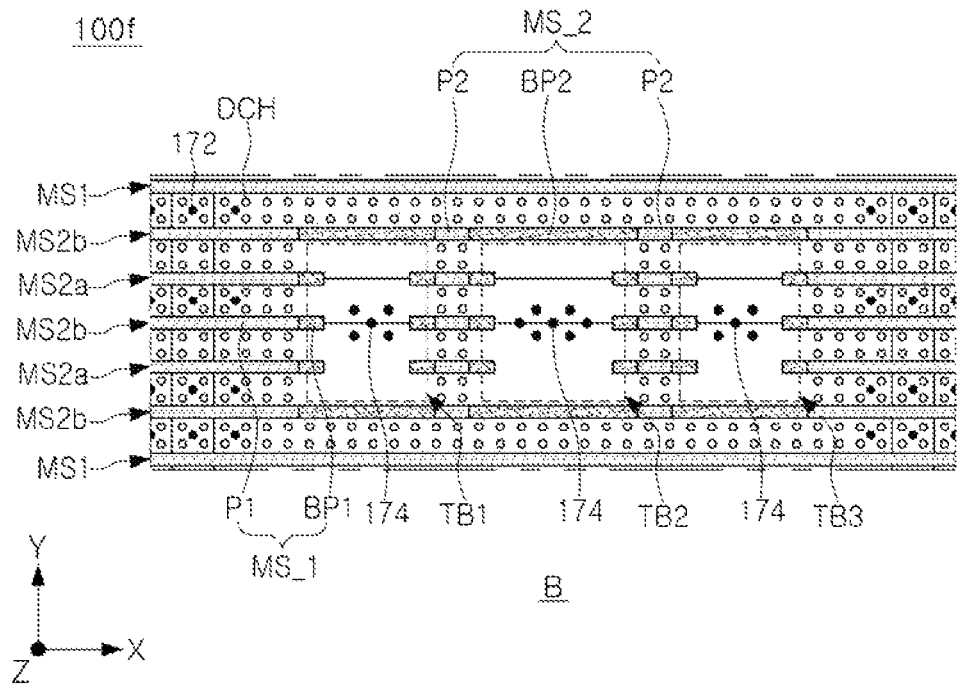

Referring to FIG. 9C, in a semiconductor device 100f, three through-regions TB1, TB2, and TB3 may be disposed between a pair of first separation regions MS1. The through-regions TB1, TB2 and TB3 may include a first through-region TB1, a second through-region TB2, and a third through-region TB3 spaced apart from each other in an X direction. Through-contact plugs 174 may be disposed in each of the first through-region TB1, the second through-region TB2, and the third through-region TB3. The first to third through-regions TB1, TB2, and TB3 may have different sizes. For example, the second through-region TB2 may have a larger size than the first through-region TB1 and the third through-region TB3, and a greater number of contact plugs 174 may be disposed in the second through-region TB2 than in the first and third through-regions TB1 and TB3.

The first separation patterns MS_1 may be disposed as a plurality of first separation patterns. The second separation patterns MS_2 may be disposed as a plurality of second separation patterns. A structure of the plurality of first barrier patterns BP1 and a structure of the plurality of second barrier patterns BP2 may be understood with reference to the description of the example embodiment given with reference to FIG. 9B.

Figure 9D:
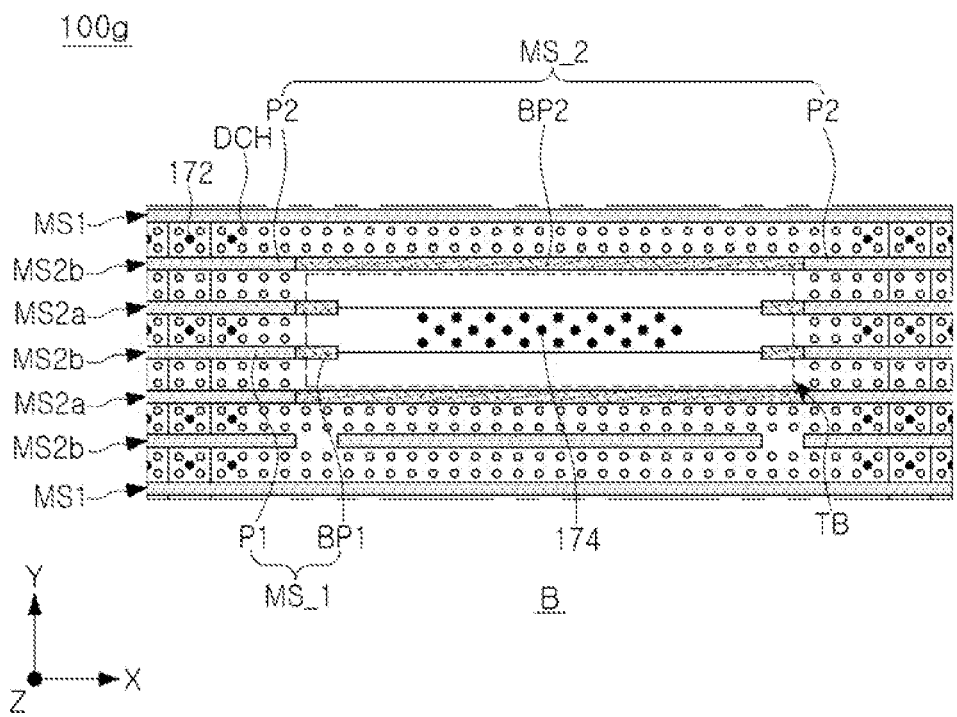

Referring to FIG. 9D, in the semiconductor device 100g, dispositions of a first separation pattern MS_1 and a second separation pattern MS_2 may be different from those in the example embodiment described with reference to FIG. 3. One of the second separation patterns MS_2, disposed adjacent to a through-region TB, may be disposed on a straight line in the X direction together with second main separation regions MS2a, and the other may be disposed on a straight line together with second auxiliary separation regions MS2*b*. The first separation patterns MS_1, extending to the through-region TB between the second separation patterns MS_2, may be one of the second main separation areas MS2*a* and the second auxiliary separation areas MS2*b*.

Figure 9E:
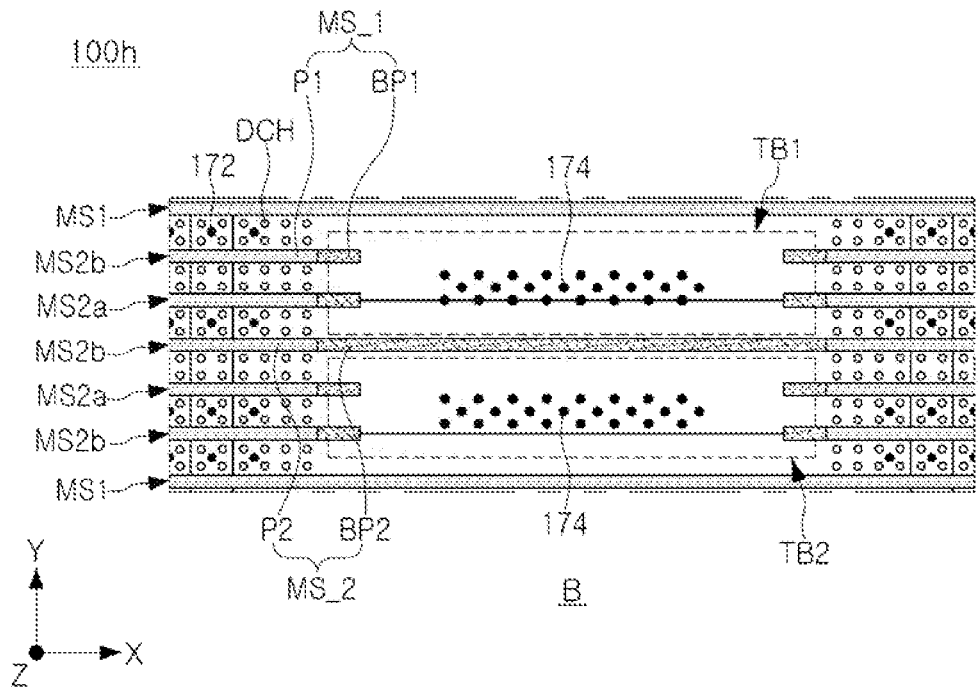

Referring to FIG. 9E, in a semiconductor device 100*h*, disposition of a first separation pattern MS_1 and a second separation pattern MS_2 may be different from those of the example embodiment described with reference to FIG. 3. Second barrier patterns BP2 of the second separation pattern MS_2 may be disposed in a portion of a second main separation region MS2*a* between first separation regions MS1. First and second through-regions TB1 and TB2 may be disposed on both sides of the second barrier patterns BP2 in a Y direction. The first and second through-regions TB1 and TB2 may be disposed to be spaced apart from the first separation regions MS1 by a predetermined distance. The first barrier patterns BP1 of the first separation pattern MS_1 may be disposed to have end portions protruding to the first and second through-regions TB1 and TB2.

Figure 9F:
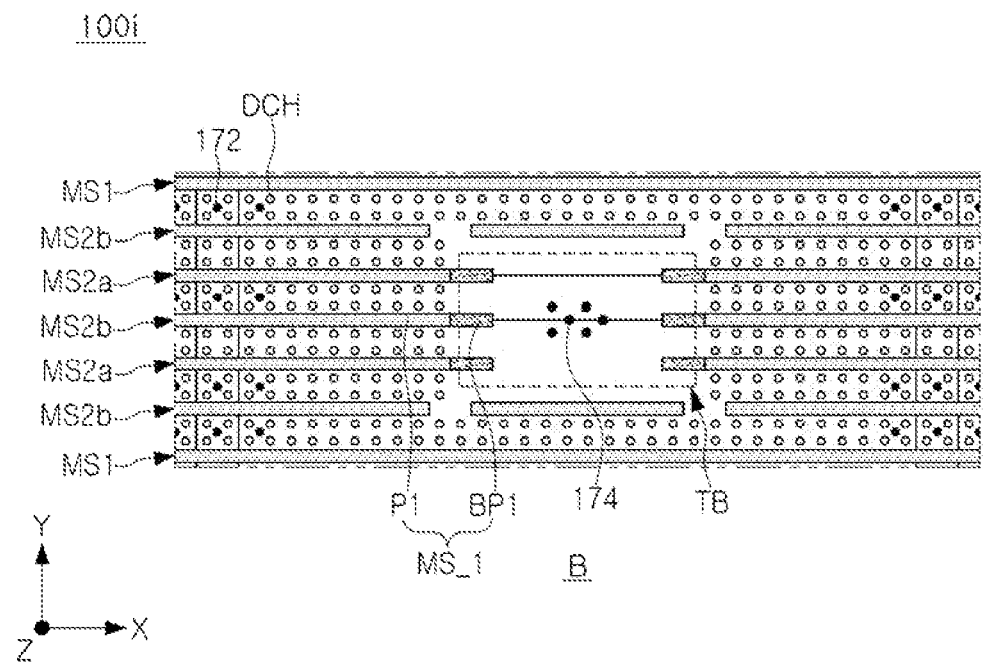

Referring to FIG. 9F, in a semiconductor device 100*i*, second barrier patterns BP2 of a second separation patterns MS_2 may be omitted. A through-region TB may be disposed to be spaced apart from second auxiliary separation regions MS2*b* in a Y direction. First barrier patterns BP1 of a first separation pattern MS_1 may be disposed to have end portions protruding to the through-region TB.

Figure 9G:
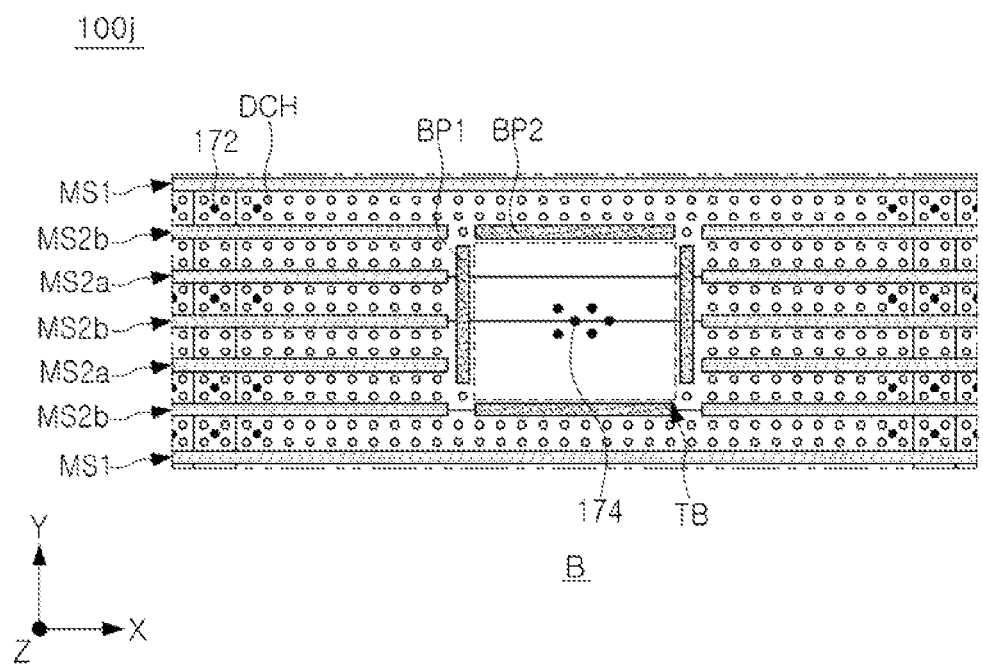

Referring to FIG. 9G, in a semiconductor device 100*j*, first barrier patterns BP1 and second barrier patterns BP2 may define a through-region TB. The first barrier patterns BP1 may extend in a Y direction, and the second barrier patterns BP2 may extend in an X direction. The first and second barrier patterns BP1 and BP2 may be spaced apart from each other. Sacrificial insulating layers 180 of the through-region TB may be in direct contact with a portion of side surfaces of the first and second barrier patterns BP1 and BP2. A boundary of an edge portion of the through-region TB may have an inwardly concave shape due to a region in which the first and second barrier patterns BP1 and BP2 are spaced apart from each other. Dummy channel structures DCH may be disposed on an edge portion of the through-region TB in a region in which the first and second barrier patterns BP1 and BP2 are spaced apart from each other. The dummy channel structures DCH, disposed on the edge portion of the through-region TB, may be omitted.

FIGS. 10A to 15 are schematic plan views and cross-sectional views illustrating a method of manufacturing a semiconductor device According to some example embodiments. Regions corresponding to FIGS. 3, 5A, and 5C are illustrated in FIGS. 10A to 15.

Figure 10A:
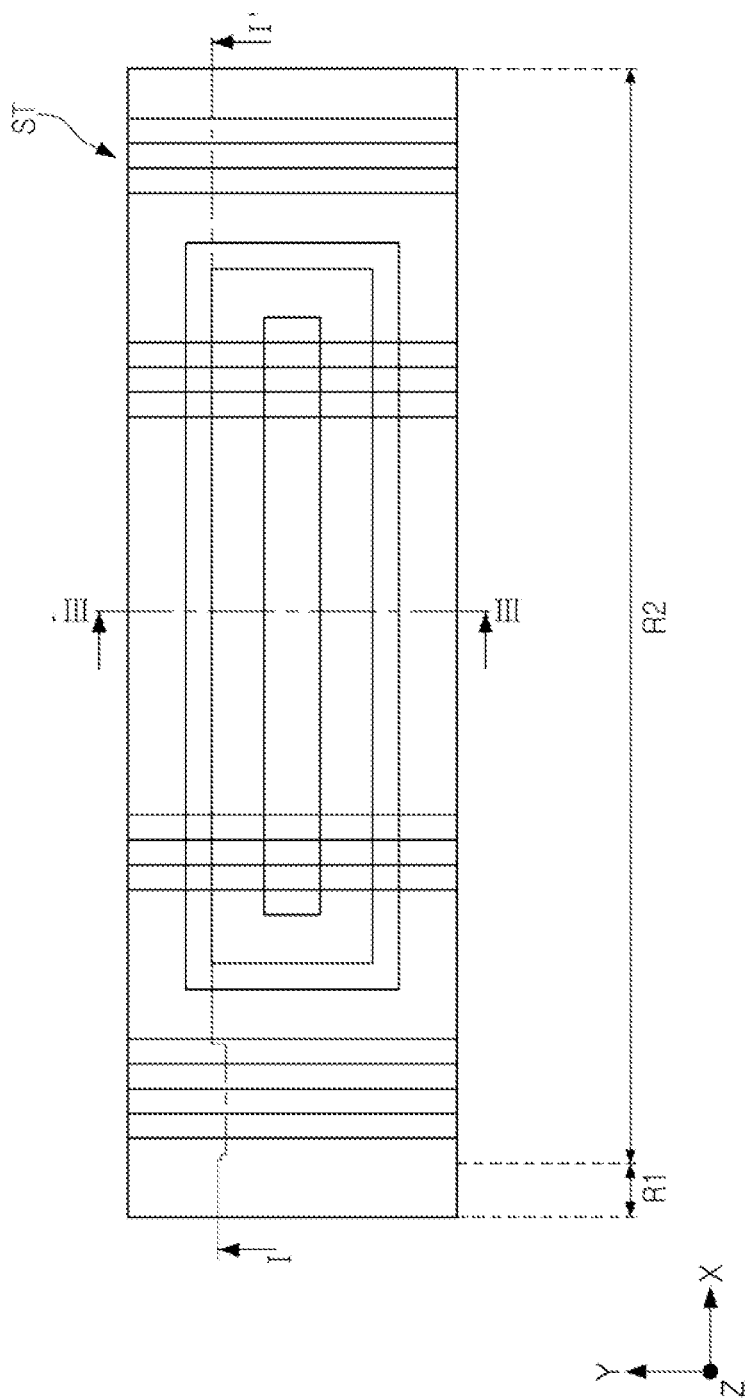
FIGS. 10A, 10B, 10C, 11A, 11B, 11C, 12A, 12B, 12C, 13A, 13B, 13C, 14A, 14B, and 15 are schematic plan views and cross-sectional views illustrating a method of manufacturing a semiconductor device According to some example embodiments.
Figure 10B:
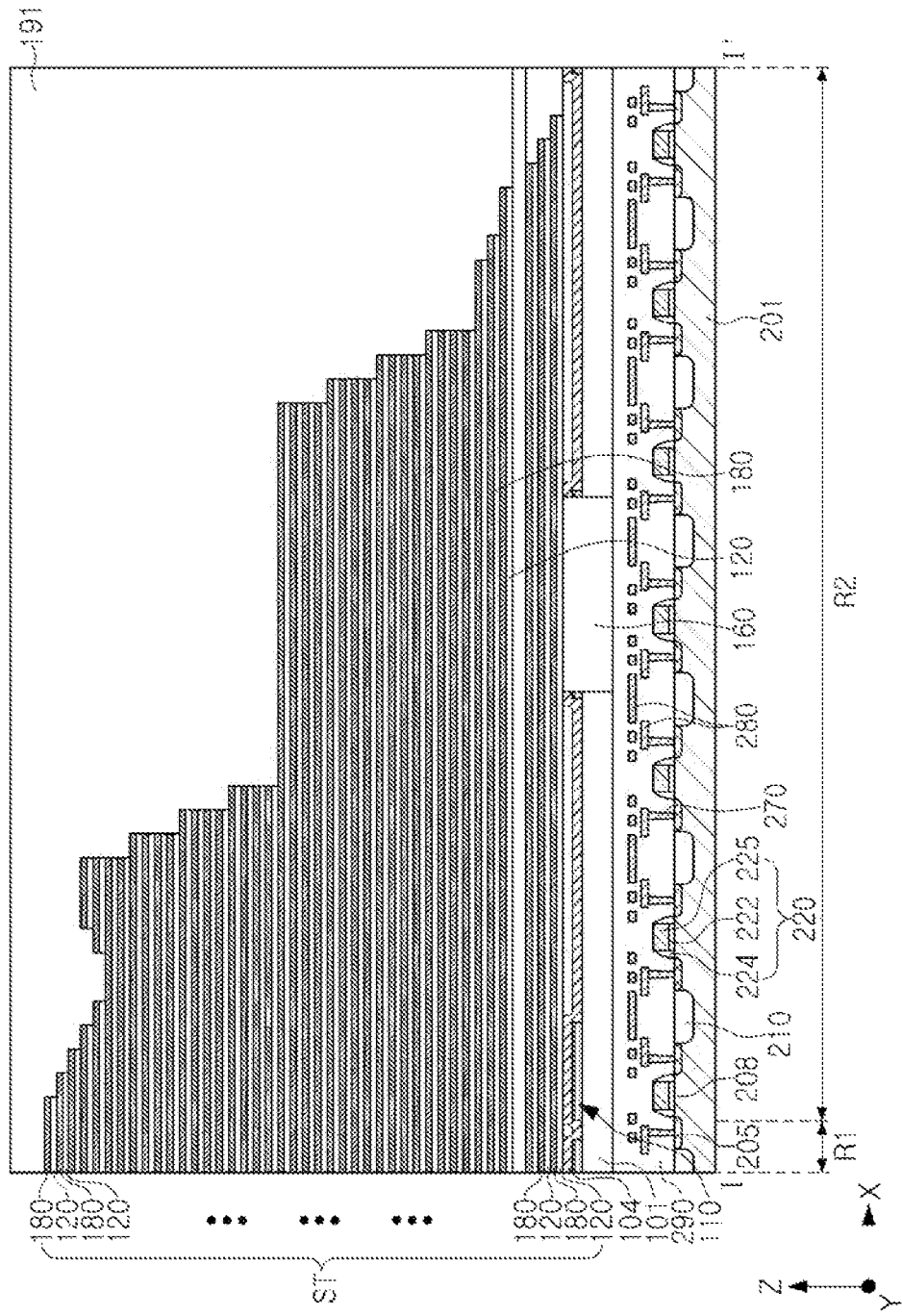
Figure 10C:
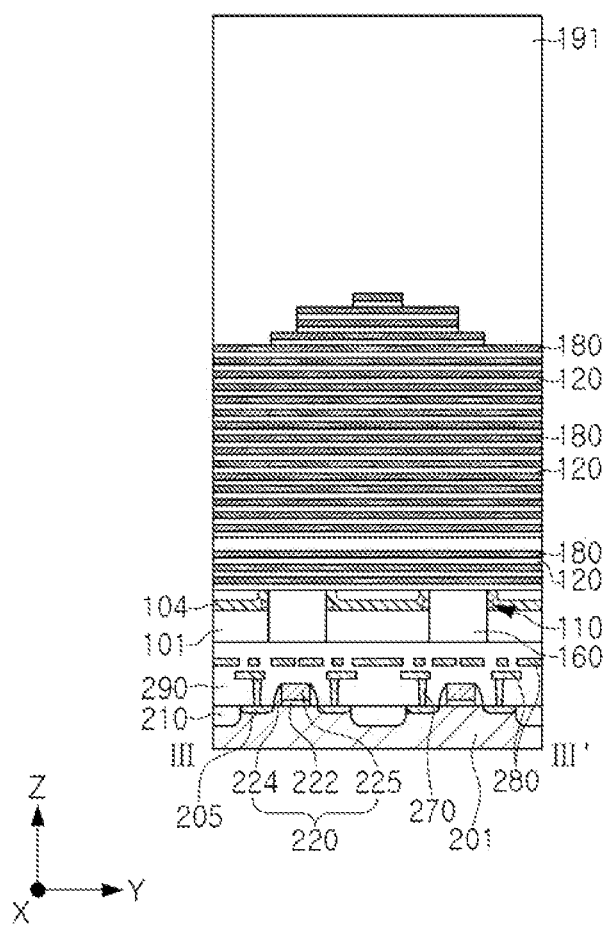

Referring to FIGS. 10A to 10C, a peripheral circuit region PERI including circuit elements 220 and lower interconnection structures may be formed on a base substrate 201. A substrate in which a memory cell region is provided above the peripheral circuit region PERI, first and second horizontal sacrificial layers 111 and 112, a second horizontal conductive layer 104, and a lower through-insulating layer 160 may be formed, and then sacrificial insulating layers 180 and interlayer insulating layers 120 may be alternately stacked.

A circuit gate dielectric layer 222 and a circuit gate electrode 225 may be sequentially formed on the base substrate 201. The circuit gate dielectric layer 222 and the circuit gate electrode 225 may be formed using atomic layer deposition (ALD) or chemical vapor deposition (CVD). The circuit gate dielectric layer 222 may be formed of a silicon oxide and the circuit gate electrode 225 may be formed of at least one of polysilicon or metal silicide. A spacer layer 224 and source/drain regions 205 may be formed on opposite sidewalls of the circuit gate dielectric layer 222 and the circuit gate electrode 225. According to some example embodiments, the spacer layer 224 may include a plurality of layers. An ion implantation process may be performed to form the source/drain regions 205.

In the lower interconnection structures, circuit contact plugs 270 may be formed by forming a portion of a peripheral region insulating layer 290, etching the portion of the peripheral region insulating layer 290 to be removed, and filling the etched portion with a conductive material. Lower interconnection lines 280 may be formed by depositing a conductive material and patterning the deposited conductive material.

The peripheral region insulating layer 290 may include a plurality of insulating layers. A portion of the peripheral region insulating layer 290 may be formed in respective operations of forming the lower interconnection structure, and may be formed above an uppermost lower interconnection line 280. Ultimately, the portion of the peripheral region insulating layer 290 may be formed to cover the circuit elements 220 and the lower interconnection structures.

A substrate 101 may be formed on the peripheral region insulating layer 290. The substrate 101 may be formed of, for example, polysilicon and may be formed by a CVD process. The polysilicon, forming the substrate 101, may include impurities. The substrate 101 may be formed to have a size smaller than or equal to a size of the base substrate 201.

Lower sacrificial layers 110, including first and second horizontal sacrificial layers 111 and 112, and a second horizontal conductive layer 104 may be formed. The first horizontal sacrificial layers 111 may be formed above and below the second horizontal sacrificial layer 112. The first horizontal sacrificial layer 111 may be formed of a material having an etching selectivity with respect to the second horizontal sacrificial layer 112. For example, the first horizontal sacrificial layers 111 may be formed of a silicon oxide, and the second horizontal sacrificial layers 112 may be formed of a silicon nitride. The second horizontal conductive layer 104 may be formed of a semiconductor material.

A lower through-insulating layer 160 may be formed by removing a portion of the substrate 101, a portion of the first and second horizontal sacrificial layers 111 and 112, and a portion of the second horizontal conductive layer 104 in a region corresponding to the through-region TB and filling the removed portions with an insulating material. After the removed portions with the insulating material, a planarization process may be further performed using a chemical mechanical polishing (CMP) process.

Some of the sacrificial insulating layers 180 may be replaced with gate electrodes 130 (see FIG. 5A) through a subsequent process. The sacrificial insulating layers 180 may be formed of a material that is different from a material of the interlayer insulating layers 120, and may be formed of a material which may be etched with an etching selectivity with respect to the interlayer insulating layers 120 under a specific etching condition. For example, the interlayer insulating layer 120 may be formed of at least one of a silicon oxide and a silicon nitride, and the sacrificial insulating layers 180 may be formed of a material that is different from a material of the interlayer insulating layer 120 selected silicon, a silicon oxide, a silicon carbide, and a silicon nitride. In some example embodiments, the interlayer insulating layers 120 may not all have the same thickness. The relative thicknesses of the interlayer insulating layers 120 and the sacrificial insulating layers 180 and the number of layers, constituting the interlayer insulating layers 120 and the sacrificial insulating layers 180, may be changed from those illustrated in the drawings.

On a second region R2 of the substrate 101, a photolithography process and an etching process may be repeatedly performed on sacrificial insulating layers 180 using a mask layer such that overlying sacrificial insulating layers 180 may extend shorter than underlying sacrificial insulating layers 180. Accordingly, the sacrificial insulating layers 180 may have a staircase shape, and pad regions may be provided.

Then, a first insulating layer 191 may be formed to cover an upper portion of a stack structure of the sacrificial insulating layers 180 and the interlayer insulating layers 120.

Figure 11A:
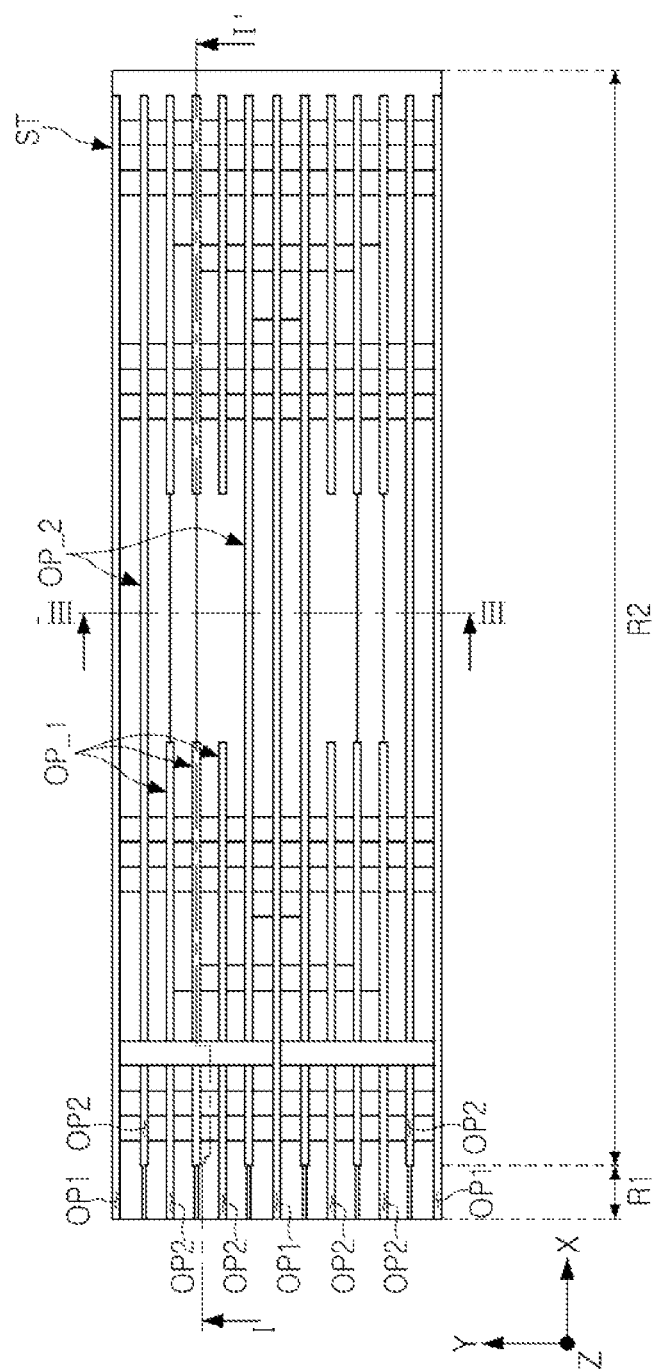
Figure 11B:
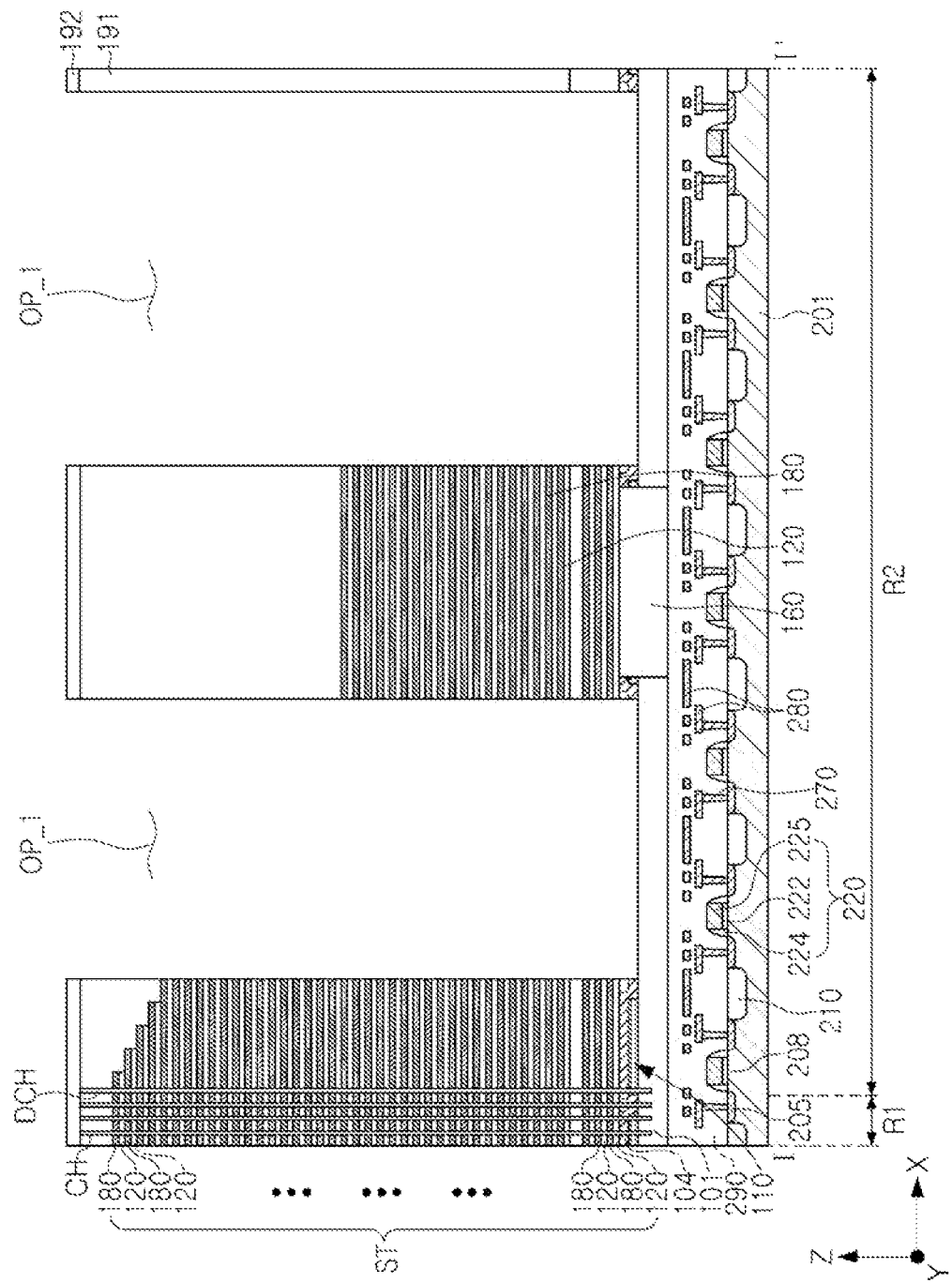
Figure 11C:
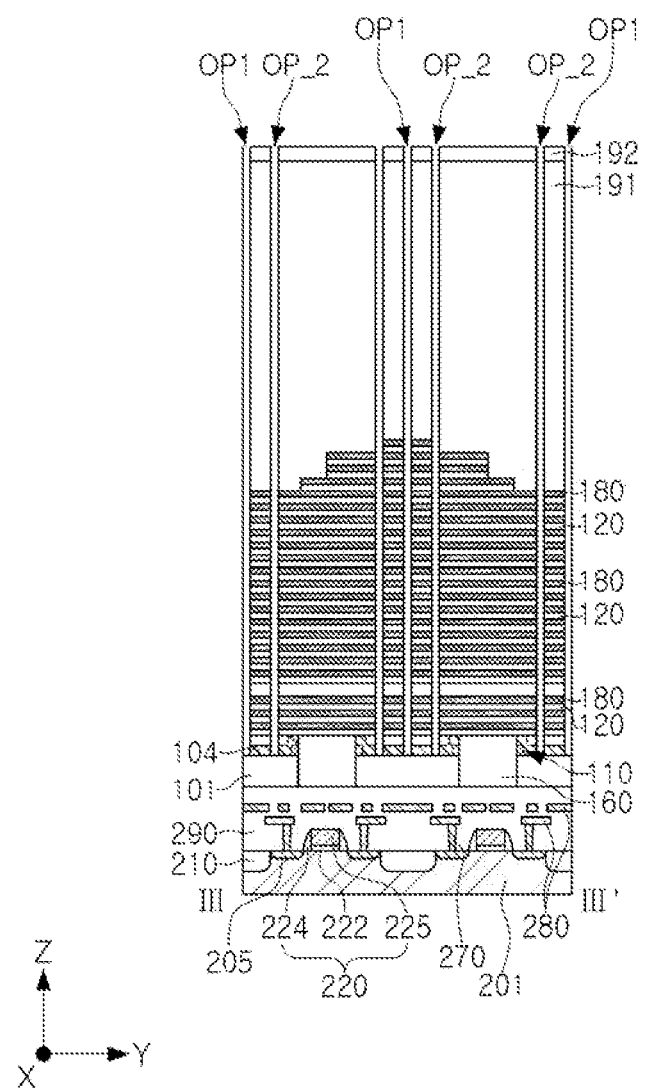

Referring to FIGS. 11A to 11C, upper separation regions SS may be formed, channel structures CH and dummy channel structures DCH may be formed, and openings OP may be formed to penetrate through a stack structure of sacrificial insulating layers 180 and interlayer insulating layers 120.

Portions of the sacrificial insulating layers 180 and the interlayer insulating layers 120 may be removed to form the upper separation regions SS. The upper separation regions SS may be formed by exposing a region, in which the upper separation regions SS are to be formed, using an additional mask layer, removing a predetermined number of sacrificial insulating layers 180 and interlayer insulating layers 120 from an uppermost portion, and depositing an insulating material.

The channel structures CH and the dummy channel structures DCH may be formed by anisotropically etching the sacrificial insulating layers 180 and the interlayer insulating layers 120, and may be formed by forming hole-like channel holes and filling the channel holes. Due to a height of the stack structure, sidewalls of the channel structures CH and the dummy channel structures DCH may not be perpendicular to an upper surface of the substrate 101. The channel Structures CH and the dummy channel structures DCH may be formed to recess a portion of the substrate 101. Then, at least a portion of a gate dielectric layer 145, a channel layer 140, a channel insulating layer 150, and channel pads 155 may be sequentially formed in the channel structures CH and the dummy channel structures DCH.

The gate dielectric layer 145 may be formed to have a uniform thickness using an ALD or CVD process. In this operation, the entirety of or a portion of the gate dielectric layer 145 may be formed, and a portion extending vertically to the substrate 101 along the channel structures CH and the dummy channel structures DCH may be formed. The channel layer 140 may be formed on the gate dielectric layer 145 in the channel structures CH and the dummy channel structures DCH. The channel insulating layer 150 may be formed to fill the channel structures CH and the dummy channel structures DCH, and may include an insulating material. According to some example embodiments, a space between the channel layers 140 may be filled with a conductive material, rather than the channel insulating layer 150. The channel pad 155 may be formed of a conductive material, for example, polysilicon.

Before forming the openings OP, a second insulating layer 192 may be formed on the channel structures CH and the first insulating layer 191.

The openings OP may be formed in locations of the first and second separation regions MS1, MS2a, and MS2b in FIG. 3. For example, the openings OP may include first openings OP1 and second openings OP2 of the second separation regions MS2a and MS2b in locations of the first separation regions MS1. Some of the second openings OP2 may include opening patterns OP_1 and OP_2 formed adjacent to a location in which the through-region TB is to be formed. The openings OP may be formed by forming a mask layer using a photolithography process and anisotropically etching the stack structure of the sacrificial insulating layers 180 and the interlayer insulating layers 120. The openings OP may be in the form of a trench extending in an X direction, and the substrate 101 may be exposed below the opening OP.

After forming additional sacrificial spacer layers in the openings OP, a second horizontal sacrificial layer 112 may be selectively removed through the openings OP, and then first horizontal sacrificial layer 111 may be removed. The first and second horizontal sacrificial layers 111 and 112 may be removed by, for example, a wet etching process. During the process of removing the first horizontal sacrificial layer 111, an exposed portion of the gate dielectric layer 145 may also be removed in a region in which the second horizontal sacrificial layer 112 is removed. A conductive material may be deposited on a region, in which the first and second horizontal sacrificial layers 111 and 112 are removed, to form a first horizontal conductive layer (see FIG. 6C), and then the sacrificial spacer layers may be removed in the openings OP.

Figure 12A:
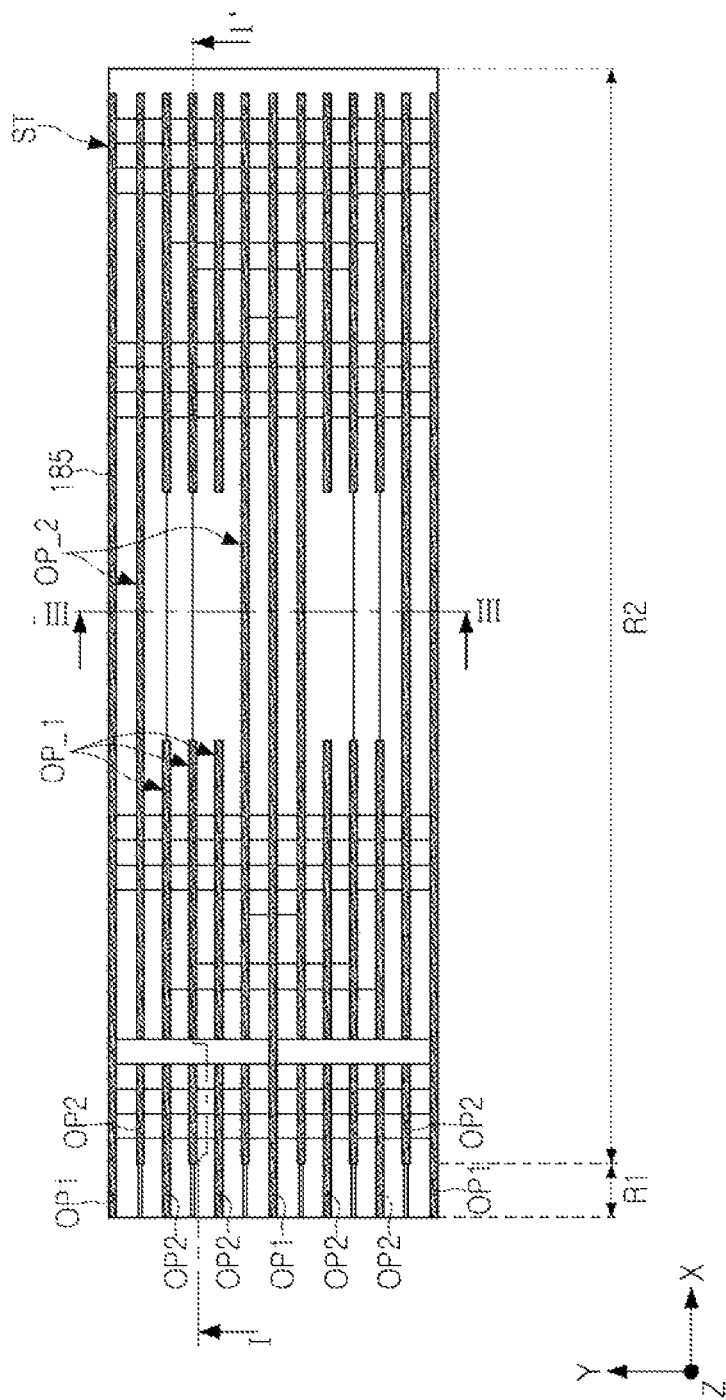
Figure 12B:
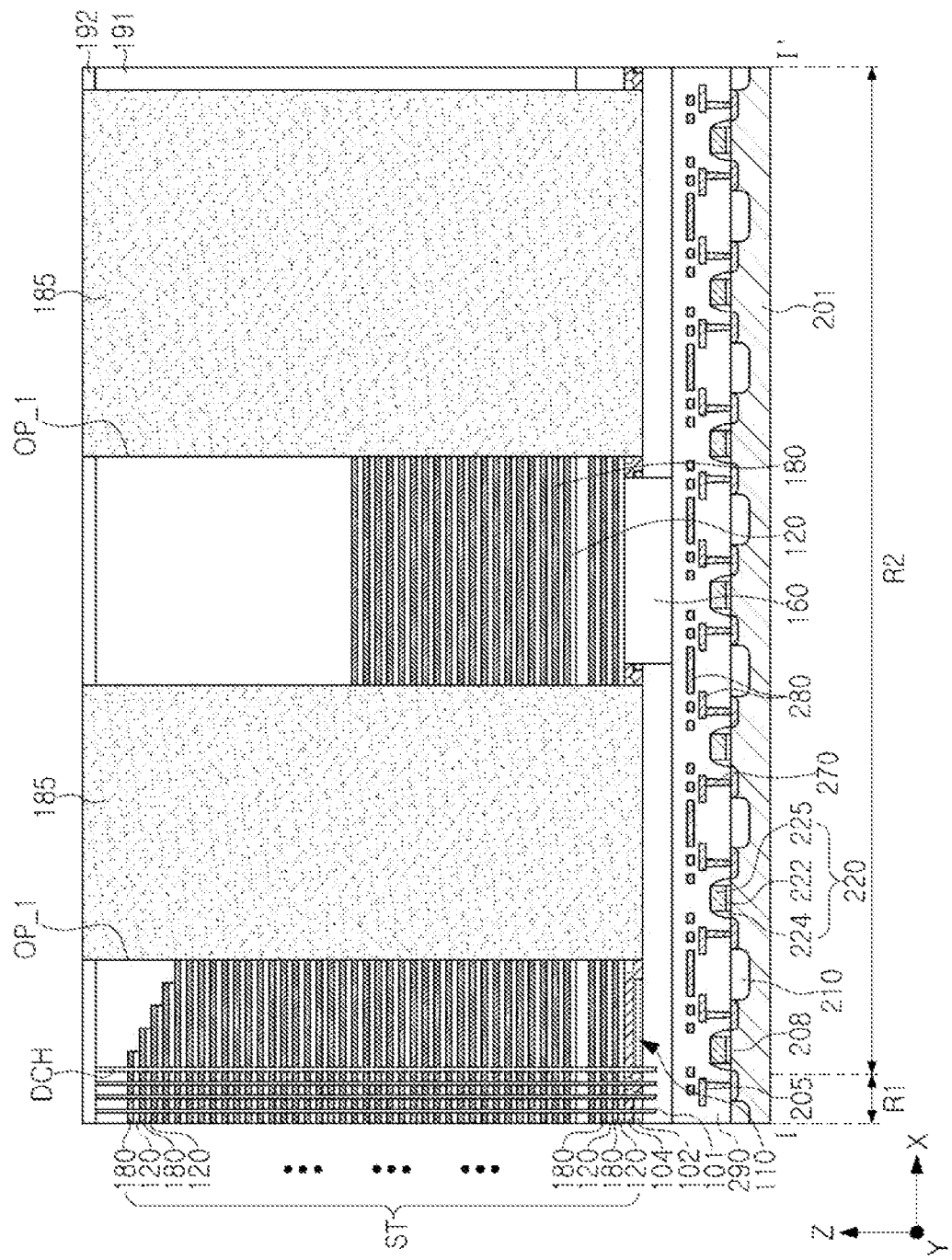
Figure 12C:
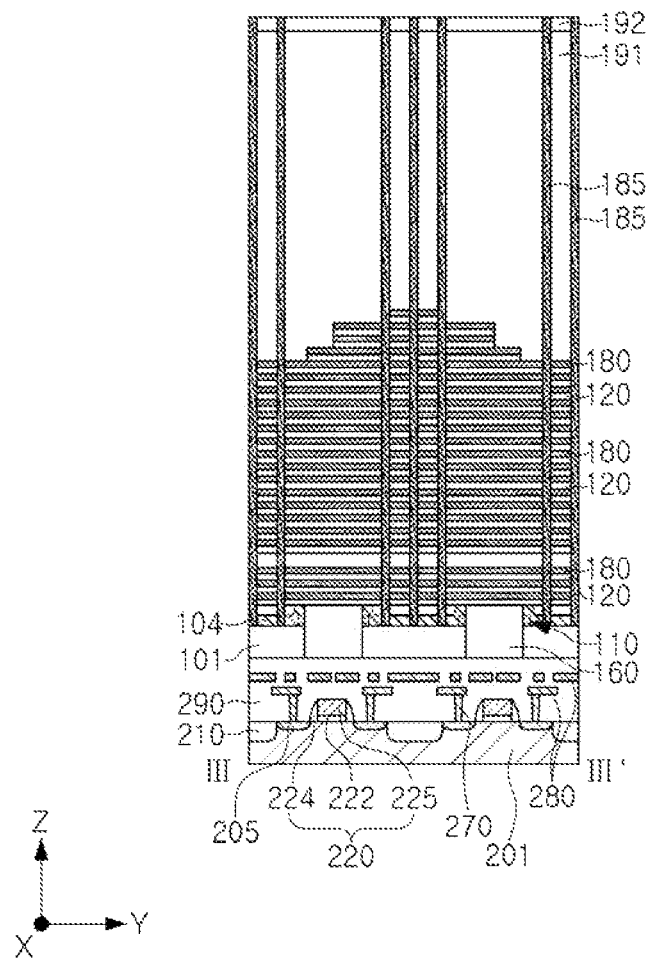

Referring to FIGS. 12A to 12C, sacrificial separation insulating layers 185 may be formed in the openings OP.

The sacrificial separation insulating layer 185 may be formed to fill the openings OP through, for example, an ALD or CVD process. The sacrificial separation insulating layer 185 may be formed of a material that is different from the sacrificial insulating layers 180. The sacrificial separation insulating layer 185 may be formed of a material which may be etched with an etching selectivity with respect to the sacrificial insulating layers 180 under a specific etching condition. According to some example embodiments, the sacrificial separation insulating layer 185 may include a plurality of layers.

Referring to FIG. 3A to 13C, a portion of the sacrificial separation insulating layer 185 may be removed to form first and second barrier patterns BP1 and BP2.

The first and second barrier patterns BP1 and BP2 may be formed by forming a mask layer on a region, in which the first and second barrier patterns BP1 and BP2 in the opening patterns OP_1 and OP_2 are to be formed, using a photolithography process, and then anisotropically etching the sacrificial separation insulating layer 185 that is not covered with the mask layer.

Figure 14A:
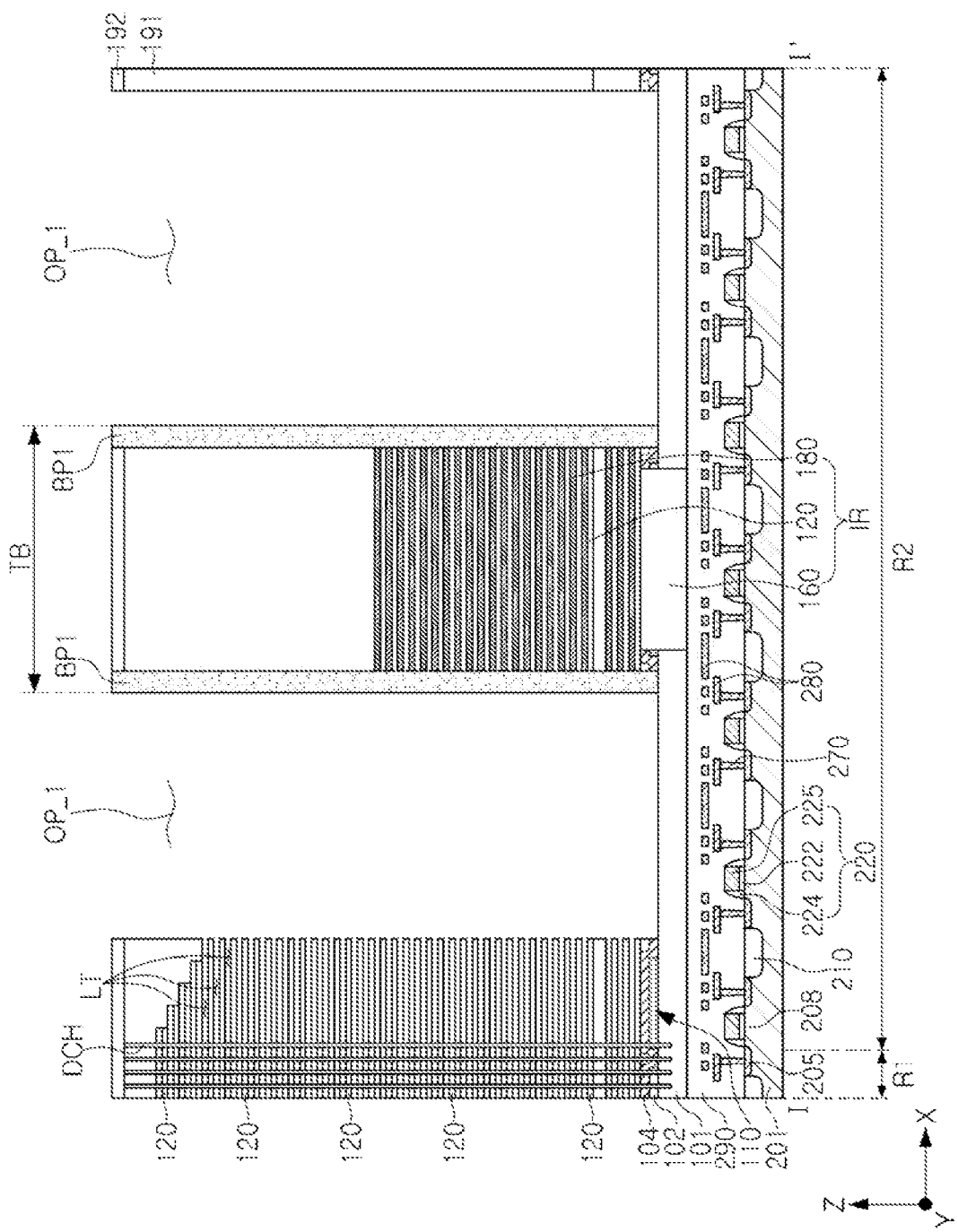
Figure 14B:
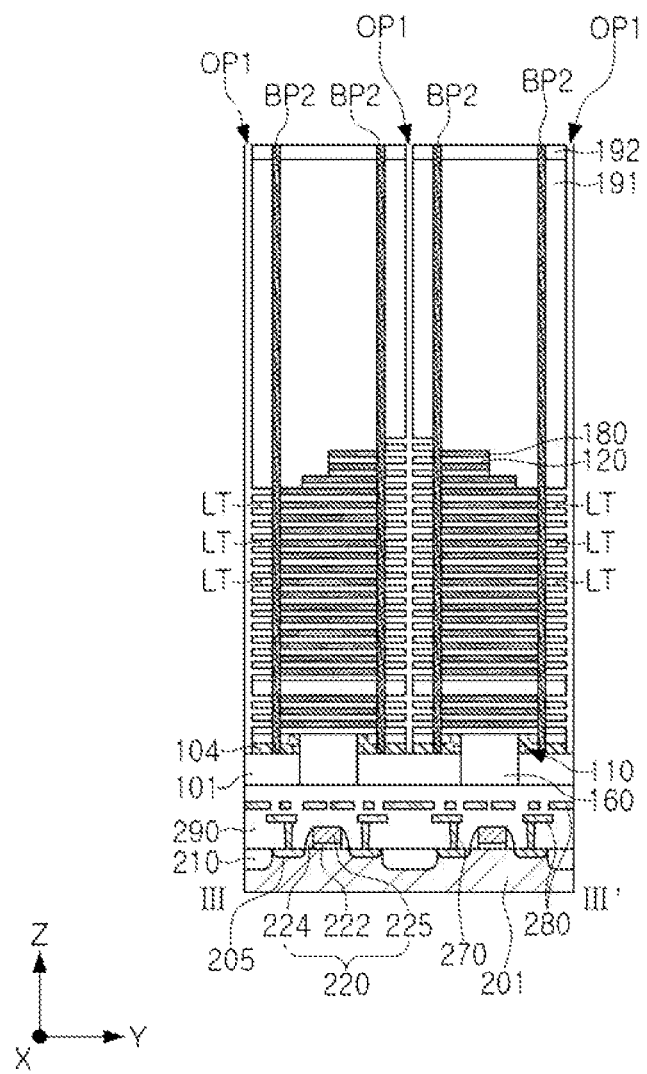

Referring to FIGS. 14A and 14B, some of the sacrificial insulating layers 180 may be removed through the openings OP to form lateral openings LT.

The sacrificial insulating layers 180 may be removed in a region outside the through-region TB, for example, on an external side of the insulating region IR to define an insulating region IR of the through-region TB, including the interlayer insulating layers 120, the sacrificial insulating layers 180, and the lower through-insulating layer 160. The sacrificial insulating layers 180 may be selectively removed with respect to the interlayer insulating layers 120 and the first and second barrier patterns BP1 and BP2 using, for example, a wet etching process. Accordingly, a plurality of lateral openings LT may be formed between the interlayer insulating layers 120, and some sidewalls of the gate dielectric layer 145 of the channel structures CH may be exposed through the lateral openings LT.

Since a region in which the through-region TB is formed is separated from the opening OP by the first and second barrier patterns BP1 and BP2, an etchant does not reach the region in which the through-region TB is formed, and the sacrificial insulating layers 180 may remain in the region in which the through-region TB is formed.

Figure 15:
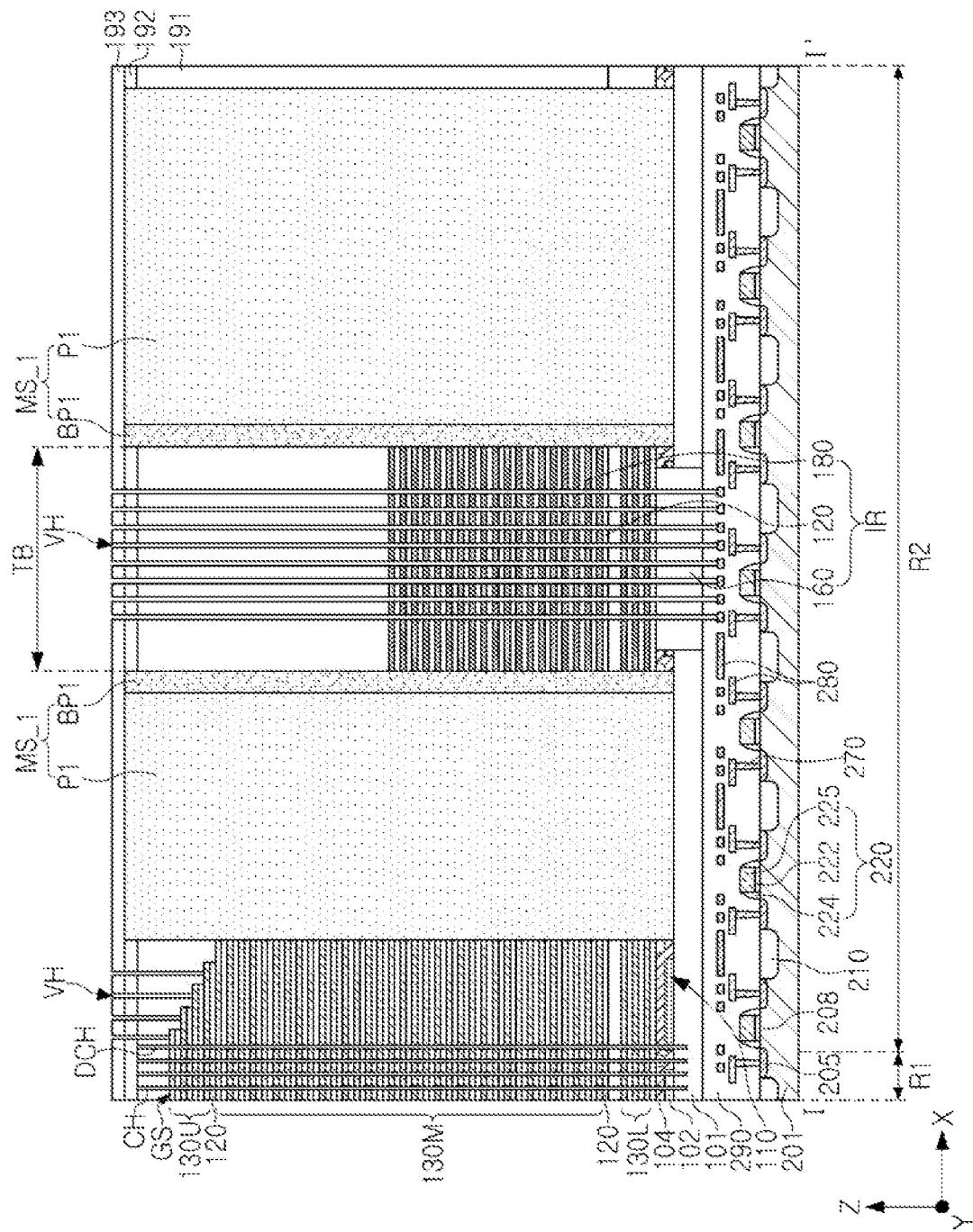

Referring to FIG. 15, a conductive material may fill the lateral openings LT, in which some of the sacrificial insulating layers 180 are removed, to form gate electrodes 130, and an insulating layer may be formed in the opening OP. A third insulating layer 193 may be formed, and contact holes VH for forming through-contact plugs 174 may be formed. In addition, contact holes for forming the gate contact plugs 172 may be formed.

An insulating material layer may be formed in the opening OP to form first and second separation regions MS1, MS2a, and MS2b including the first separation pattern MS_1 and the second separation pattern MS_2.

Contact holes VH, penetrating through the first, second, and third insulating layers 191, 192, and 193 and the insulating region IR, may be formed from an upper portion of the insulating region IR. A circuit interconnection line 280 of the peripheral circuit region PERI may be exposed on lower ends of the contact holes VH.

Referring to FIGS. 3 to 5C together, the contact holes VH may be filled with a conductive material to form through-contact plugs 174. In addition, the contact holes for forming the gate contact plugs 174 may be filled with the conductive material to form the gate contact plug 174. A fourth insulating layer 194 may be formed, additional contact plugs 171, 173, and 175 may be formed to respectively connect the channel structures CH, the gate contact plugs 172 on the gate electrodes 130, and the through-contact plugs 174, and an interconnection line 176 may be formed to be connected to each of the contact plugs 171, 173, and 175. However, the manufacturing method described with reference to FIGS. 10A to 15 is only an example for manufacturing the semiconductor device 100 in FIGS. 3 to 5C, and the semiconductor device 100 may be manufactured by various manufacturing methods.

Figure 16A:
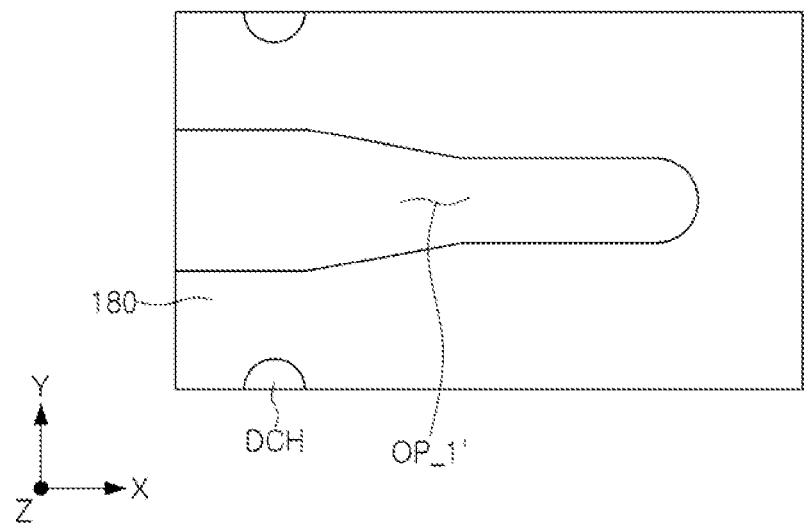
FIGS. 16A, 16B, and 16C are schematic plan views illustrating a method of manufacturing a semiconductor device According to some example embodiments.
Figure 16B:
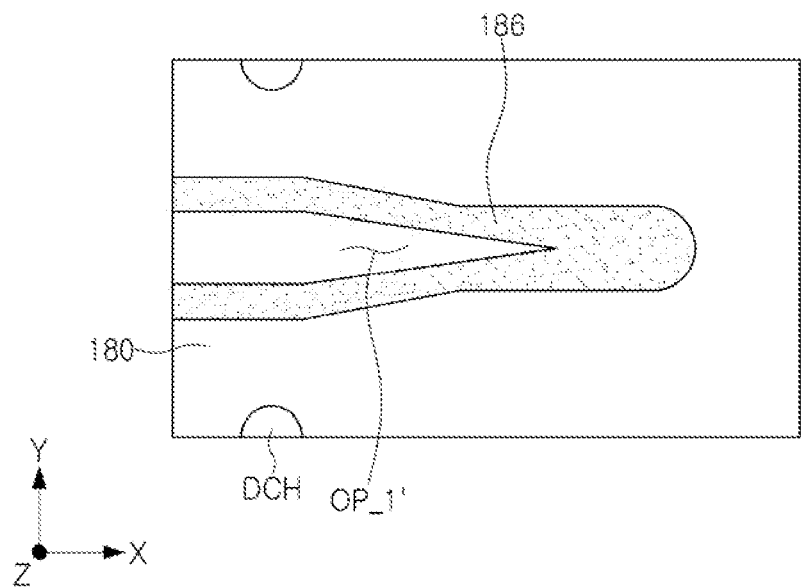
Figure 16C:
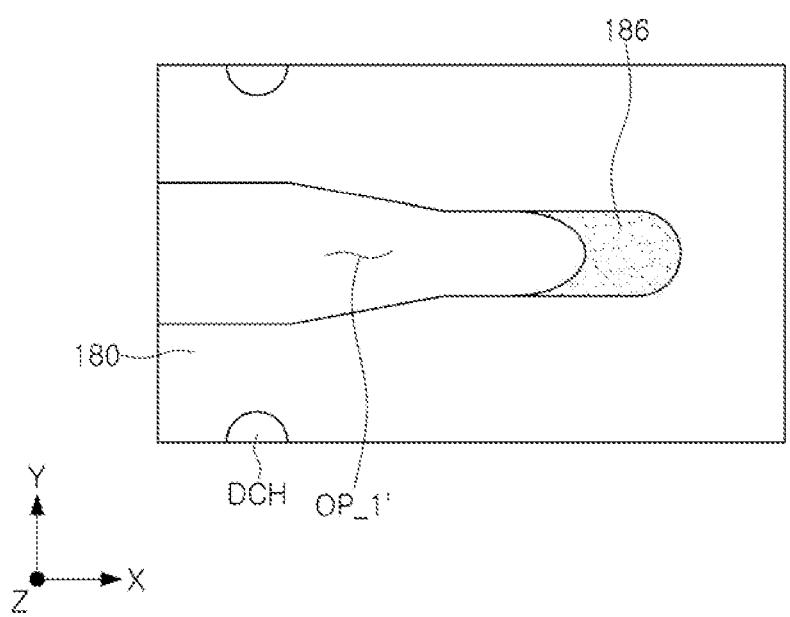

FIGS. 16A to 16C are schematic plan views illustrating a portion of a method of manufacturing a semiconductor device according to some example embodiments. Regions corresponding to FIG. 8A are illustrated in FIGS. 16A to 16C.

Referring to FIG. 16A, opening patterns OP_1', having a region in which a width of an end portion thereof is decreased, may be formed.

According to the method described with reference to FIGS. 10A to 11C, a peripheral circuit region PERI, a substrate 101 provided with a memory cell region, first and second horizontal sacrificial layers 111 and 112, a second horizontal conductive layer 104, a lower through-insulating layer 160, sacrificial insulating layers 180, interlayer insulating layers 120, upper separation regions SS, channel structures CH, and dummy channel structures DCH may be formed.

In an operation of forming openings OP to penetrate a stack structure of the sacrificial insulating layers 180 and the interlayer insulating layers 120, at least one of the openings OP may be formed to have a region in which a width of an end portion thereof is decreased. For example, a width of a region, in which a first barrier pattern BP1 is to be formed in the opening patterns OP_1', may be formed to be smaller than a width of a region in which a first pattern portion P1 is to be formed. The opening patterns OP_1' may include a portion in which a width is decreased in a direction toward an end portion.

Referring to FIG. 16B, an insulating spacer layer 186 may be formed to cover internal walls of the opening patterns OP_1'.

The insulating spacer layer 186 may be formed to conformally cover the internal walls of the opening patterns OP_1'. The insulating spacer layer 186 may be in contact at facing sides thereof where the insulating spacer layer 186 fills spaces between the internal walls that face each other at narrowed end portions of the opening patterns OP_1', such that a horizontal thickness of the insulating spacer layer 186 may be relatively increased at the narrowed end portions of the opening patterns OP_1'.

Referring to FIG. 16C, a portion of the insulating spacer layer 186 may be removed using an etching process to form a first barrier pattern BP1.

A portion of the insulating spacer layer 186 in the opening patterns OP_1' may be removed using, for example, a wet etching process, while another portion of the insulating spacer layer 186 may not be removed and remain on the narrowed end portion of the opening patterns OP_1'. The insulating spacer layer 186 that remains on the end portion may be the first barrier pattern BP1 in FIG. 8A.

Referring to FIGS. 14A to 15 and FIGS. 3 to 5C together, the sacrificial insulating layers 180 may be removed to form the through-region TB, and then the gate electrodes 130, the through-contact plugs 174, and the like, may be formed to manufacture the semiconductor device 100b in FIG. 8A.

As illustrated in FIGS. 16A to 16C, a semiconductor layer may be formed to cover an internal wall of an insulating spacer layer, and then an etching process may be performed to form the first barrier pattern BP1 of the semiconductor device 100c in FIG. 8B.

As described above, a barrier pattern may be disposed in an opening, in which separation regions are to be formed, to adjust a horizontal distance at which an etchant is delivered through the opening. Thus, an unfill issue of a conductive material for forming a gate electrode may be addressed and a semiconductor device having improved electrical characteristics may be provided.

As described above, example embodiments may provide a semiconductor device having improved electrical characteristics and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a peripheral circuit region on a first substrate and including circuit elements;
a stack structure provided on a second substrate disposed on the peripheral circuit region and including:
gate electrodes stacked to be spaced apart from each other in a first direction perpendicular to an upper surface of the second substrate on a first region of the second substrate and extending while having a staircase shape in a cross-sectional view in a second direction perpendicular to the first direction on a second region of the second substrate, and interlayer insulating layers stacked alternately with the gate electrodes;

a channel structure penetrating through the stack structure, extending vertically on the second substrate, and including a channel layer;

a separation structure penetrating through the stack structure and extending in the second direction, and including a first separation pattern and a pair of second separation patterns disposed to be parallel to the first separation pattern;

a through-region disposed between the pair of second separation patterns and including a lower through-insulating layer penetrating through the second substrate, and the interlayer insulating layers and sacrificial insulating layers sequentially stacked on the lower through-insulating layer; and through-contact plugs extending in the first direction through the through-region and electrically connected to the circuit elements of the peripheral circuit region, wherein the sacrificial insulating layers have side surfaces opposing the gate electrodes, and wherein an end portion of the first separation pattern protrudes further than at least some of the side surfaces of the sacrificial insulating layers toward the through-region.

2. The semiconductor device as claimed in claim 1, wherein the end portion of the first separation pattern is in direct contact with the sacrificial insulating layers.

3. The semiconductor device as claimed in claim 1, wherein the first separation pattern includes a first barrier pattern having the end portion of the first separation pattern and a first pattern portion that extends from the first barrier pattern in the second direction, and wherein a material composition of the first barrier pattern includes a material that is different from a material composition of the sacrificial insulating layers.

4. The semiconductor device as claimed in claim 3, wherein the first barrier pattern and the first pattern portion include materials that are different from each other.

5. The semiconductor device as claimed in claim 1, wherein a portion of a side surface of the second separation pattern is in direct contact with the sacrificial insulating layers.

6. The semiconductor device as claimed in claim 5, wherein the second separation pattern includes:

a second barrier pattern, having the portion of the side surface of the second separation pattern, and second pattern portions, respectively extending from both end portions of the second barrier pattern in the second direction, and wherein the second barrier pattern includes a material that is different from a material composition of the sacrificial insulating layers.

7. The semiconductor device as claimed in claim 6, wherein the second barrier pattern and the second pattern portions include materials that are different from each other.

8. The semiconductor device as claimed in claim 1, wherein the first separation pattern includes a first barrier pattern, having the end portion of the first separation pattern, and a first pattern portion extending from the first barrier pattern in the second direction, and wherein the first pattern portion has a width that decreases toward the first barrier pattern in a third direction, perpendicular to the second direction.

9. The semiconductor device as claimed in claim 8, wherein a width of the first barrier pattern in the third direction is smaller than the width of the first pattern portion in the third direction.

10. The semiconductor device as claimed in claim 8, wherein the first barrier pattern includes an insulating spacer layer and a semiconductor layer disposed on an internal side surface of the insulating spacer layer.

* * * * *